(12) United States Patent
Mori

(10) Patent No.: US 11,842,765 B2
(45) Date of Patent: Dec. 12, 2023

(54) SEMICONDUCTOR MEMORY DEVICE OPERATES ASYNCHRONOUSLY WITH EXTERNAL CLOCK SIGNAL

(71) Applicant: Winbond Electronics Corp., Taichung (TW)

(72) Inventor: Kaoru Mori, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 130 days.

(21) Appl. No.: 17/562,274

(22) Filed: Dec. 27, 2021

(65) Prior Publication Data

US 2022/0208255 A1 Jun. 30, 2022

(30) Foreign Application Priority Data

Dec. 28, 2020 (JP) ................................ 2020-218907

(51) Int. Cl.
*G11C 11/4096* (2006.01)
*G11C 11/4093* (2006.01)
*G11C 11/4076* (2006.01)
*G11C 11/406* (2006.01)

(52) U.S. Cl.
CPC ...... *G11C 11/4096* (2013.01); *G11C 11/4076* (2013.01); *G11C 11/4093* (2013.01); *G11C 11/40615* (2013.01)

(58) Field of Classification Search
CPC .......... G11C 11/4096; G11C 11/40615; G11C 11/4076; G11C 11/4093
USPC ...................................................... 365/189.16
See application file for complete search history.

(56) References Cited

U.S. PATENT DOCUMENTS

| 5,594,704 A | 1/1997 | Konishi et al. |
| 5,835,448 A | 11/1998 | Ohtani et al. |
| 6,347,063 B1 | 2/2002 | Dosaka et al. |
| 8,610,460 B2 * | 12/2013 | Kang ................... G11C 7/1045 365/191 |
| 2005/0117403 A1 * | 6/2005 | Fujisawa ................ G11C 7/222 365/189.05 |
| 2011/0205832 A1 * | 8/2011 | Jeon ..................... G11C 7/1057 326/30 |
| 2019/0237123 A1 * | 8/2019 | Mori ..................... G11C 11/406 |

* cited by examiner

*Primary Examiner* — Connie C Yoha
(74) *Attorney, Agent, or Firm* — Birch, Stewart, Kolasch & Birch, LLP

(57) ABSTRACT

A semiconductor memory device includes a transmission circuit and a control circuit. The transmission circuit is configured to obtain write data and transmit that into a memory cell array according to the external clock signal when the chip selection signal is asserted. The control circuit is configured to control the transmission circuit to transmit first write data into the memory cell array when the chip selection signal changes from assertion to negation during the input period of the first write data, according to the external clock signal.

18 Claims, 11 Drawing Sheets

SEMICONDUCTOR MEMORY DEVICE OPERATES ASYNCHRONOUSLY WITH EXTERNAL CLOCK SIGNAL

CROSS REFERENCE TO RELATED APPLICATIONS

The present application claims priority based on the Japanese patent application JP 2020-218907 filed on Dec. 28, 2020, the entirety of which is incorporated by reference herein.

BACKGROUND OF THE INVENTION

Field of the Invention

The present invention relates to a semiconductor memory device, and in particular it relates to a semiconductor memory device that operates asynchronously with an external clock signal.

Description of the Related Art

Current semiconductor memory devices include synchronous dynamic random access memory (SDRAM) and pseudo-static random access memory (pSRAM). For example, U.S. Pat. No. 5,594,704 discloses a SDRAM that operates synchronously with an external clock signal.

On the other hand, a pSRAM, operating asynchronously with an external clock signal uses dynamic random access memories (DRAMs) as a memory cell array to store data, and it has an interface compatible with a static random access memory (SRAM). The pSRAM uses a double data rate (DDR) method as the data-transmission method, and it may use the Expanded Serial Peripheral Interface (xSPI), HyperBus™ interface or Xccella™ interface as the access interface.

FIGS. 1 (a) and (b) show timing diagrams of various signals in response to the input of a write command in a current semiconductor memory device. Here, an example of a pSRAM using HyperBus™ is shown. In this example, the pSRAM is configured to perform a write operation when the chip select signal CS #is asserted (low level), and to stop the operation of the input receiver for the external clock signal CK to stop generating an internal clock signal when the chip select signal CS #is negated (high level). As such, the assertion of the chip select signal CS #and the external clock signal CK are asynchronous.

In the write command sequence depicted in FIG. 1, an example is shown in which the latency count is 3 and the burst length of the data to write is 4. In this example, starting from the chip select signal CS #becoming negated (high level), after the time duration tRWR (the time duration that the semiconductor memory device needs for returning to a read/write operation) and the latency count of three external clock signals CK, the data to-be-written is input at the rising edge of the sixth clock of the external clock signal CK. Here, although the exemplary latency count is 3, the value of the latency count is determined by the frequency of the external clock signal CK. For example, the latency count is higher when the frequency of the external clock signal CK is higher.

In the example shown in FIG. 1, after the chip select signal CS #changes from negated (high level) to asserted (low level), according to the first to the third clock of the external clock signal CK, a command (CMD), a row address (RA) and a column address (CA) are input successively. Then, according to the sixth clock of the external clock signal CK, the input data-to-be-written (DE6, DO6) is written into designated memory cells. Subsequently, according to the seventh clock of the external clock signal CK, the input data-to-be-written (DE7, DO7) is written into designated memory cells.

Then, when all the data-to-be-written in the write command is input, the chip select signal CS #changes from asserted to negated to end the write operation.

However, as shown in FIG. 1 (b), if the chip select signal CS #changes from asserted to negated during the input period of the data-to-be-written (DE7, DO7), then the operations of some of the circuits within the semiconductor memory device will be terminated immediately, resulting in the input data-to-be-written (DE7, DO7) being unable to be transmitted to the memory cell array, which may lead to difficulties in writing the data-to-be-written (DE7, DO7) into the designated memory cells.

BRIEF SUMMARY OF THE INVENTION

In view of the issues described above, the object of the present invention is to solve the problem of the semiconductor memory device being deactivated during data writing, which causes the data to be unable to be completely written into the semiconductor memory device.

To solve the issues described above, the present invention provides a semiconductor memory device which performs a write operation in response to an asserted chip select signal. The semiconductor memory device includes a memory cell array, a transmission circuit and a control circuit. When the chip select signal is asserted, the transmission circuit obtains data-to-be-written according to an external clock signal, and it transmits the data-to-be-written to the memory cell array. When the chip select signal changes from asserted to negated, the control circuit maintains the operation of the transmission circuit according to the external clock signal during the input of the first data-to-be-written, so as to allow the first data-to-be-written to be transmitted into the memory cell array.

According to the present invention, during the input of the first data-to-be-written according to the external clock signal, the first data-to-be-written may be transmitted into the memory cell array to write the first data-to-be-written into the memory cells of the memory cell array, even if the chip select signal changes from asserted to negated. Thus, even if the semiconductor memory device is deactivated during data writing, the data may be properly written into the semiconductor memory device.

DETAILED DESCRIPTION

In the following, referring to the figures, a semiconductor related to the embodiments of the present invention is described in detail. However, the present invention is not limited to these embodiments. Moreover, the representations "first," "second," "third" and the like are used herein to distinguish a particular element and other elements, and are not limiting the number, sequence and priority of the element.

Figure 2:
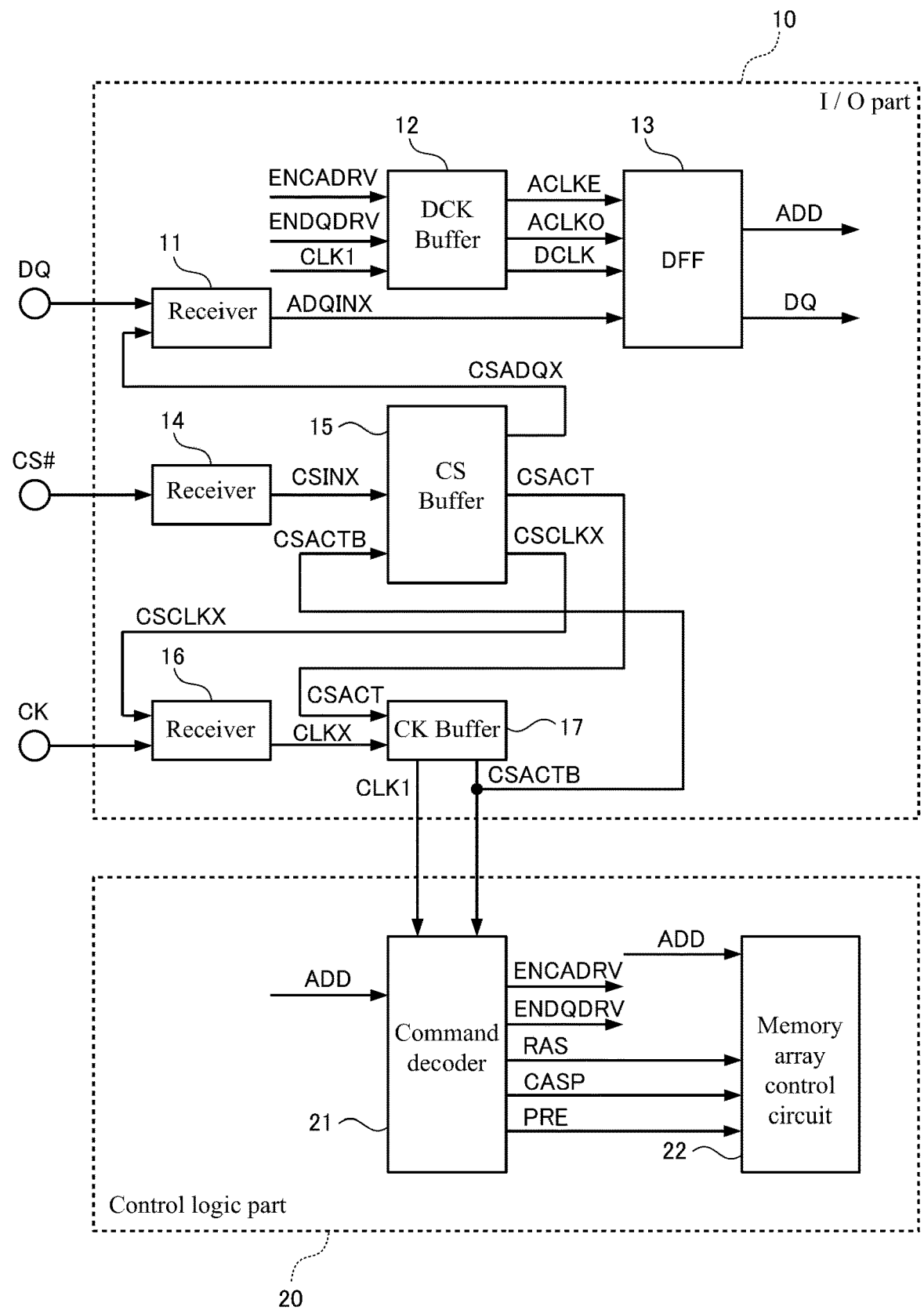
FIG. 2 shows a configuration block diagram of the input/output interface (I/O) part and the control logic part of the semiconductor memory device regarding Embodiment 1 of the present invention.

FIG. 2 shows a configuration block diagram of the semiconductor memory device regarding Embodiment 1 of the present invention. The semiconductor memory device regarding the present embodiment is a semiconductor memory device that the deactivation thereof is performed asynchronously to the external clock signal CK according to the chip select signal CS #, wherein the semiconductor memory device includes an input/output interface (I/O) part 10, a control logic part 20, and a memory cell array with a plurality of memory cells arranged in an array (omitted in the figure).

The I/O part 10 is configured to perform the receiving and sending of signals (e.g. the chip select signal CS #, the data signal DQ, the external clock signal CK, etc.) from and to an external device (e.g. the memory controller). Additionally, the control logic part 20 is configured to control the operations, such as reading or writing, to the memory cells based on a command received from the external device. Furthermore, the I/O part 10, the control logic part 20 and the memory cell array may be configured with dedicated hardware devices or logic circuits.

Figure 1:
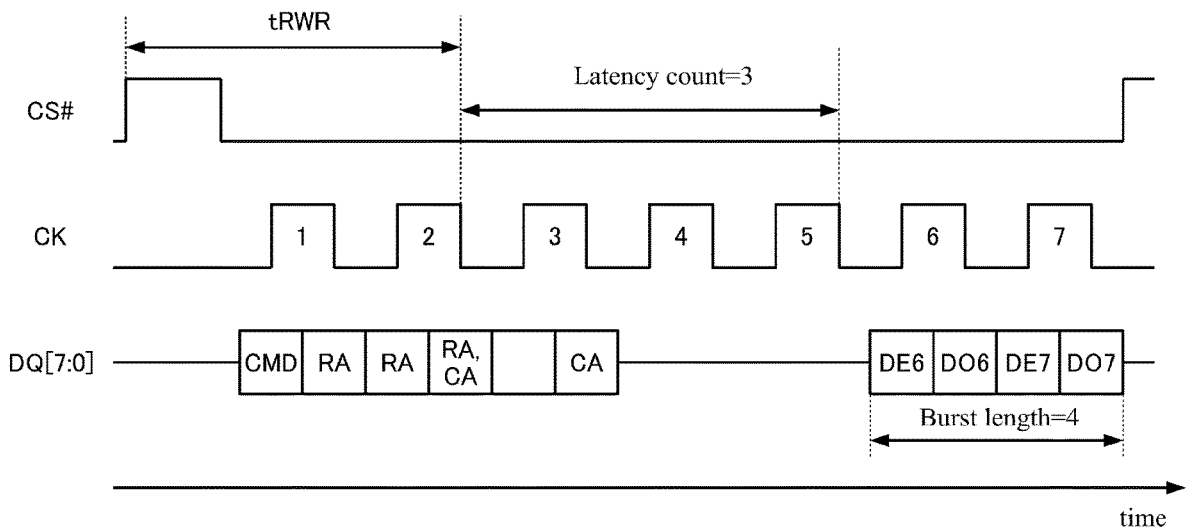
FIG. 1 (a) and FIG. 1 (b) show timing diagrams of the variation with time of signals in a current semiconductor memory device when a write command is input.
Figure 1:
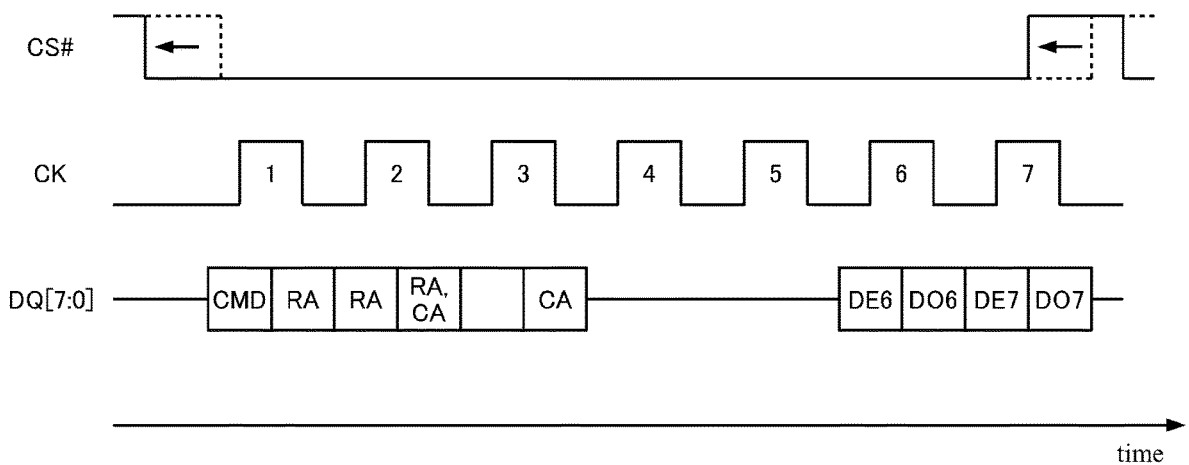

The semiconductor memory device regarding the present embodiment may be any semiconductor memory device (e.g. DRAM, pSRAM, SRAM, etc.) that the deactivation thereof is performed asynchronously to the external clock signal CK according to the chip select signal CS #. In the present embodiment, the semiconductor memory device is described with an example of a pSRAM with HyperBus™ interface. Moreover, in the present embodiment, same as the example shown in FIG. 1, the latency count in the write command sequence is 3 and the burst length of the data-to-be-written is 4. In the present embodiment, the signals identical to those shown in FIG. 1 are used as appropriate and described.

The I/O part 10 includes a receiver 11 connected to a data terminal (DQ terminal), a data clock (DCK) buffer 12, a delay flip-flop (DFF) 13, a receiver 14 connected to a chip select terminal (CS #terminal), a chip select (CS) buffer 15, a receiver 16 connected to an external clock terminal (CK terminal), and a clock (CK) buffer 17. Here, to simplify the description, the other well-known configurations of the I/O part 10 (e.g. the circuits for sending or receiving other signals (a data strobe signal, a reset signal, etc.)) are not illustrated.

The CS buffer 15 is configured to output a signal CSADQX, and the signal CSADQX is configured to activate the receiver 11 when asserted. The receiver 11 is configured to receive a data signal DQ from the external device through the DQ terminal when receiving the asserted signal CSADQX from the CS buffer. Here, the data signal DQ is input according to the external clock signal CK and includes respective commands, addresses (a row address, a column address, etc.) and data-to-be-written with a specific length (8 bits in the present embodiment). Additionally, the receiver 11 outputs the input data signal DQ to the DFF 13 as a signal ADQINX.

The DCK buffer 12 is configured to be activated according to asserted signals ENCADRV and ENDQDRV, wherein the signals ENCADRV and ENDQDRV may be provided by a command decoder 21 (described below).

Additionally, while the signal ENCADRV is asserted, in response to each rising edge of the clock of an internal clock signal CLK1 provided by the CK buffer 17, in the rising edges of the external clock signal CK corresponding to said clock, the DCK buffer 12 generates a signal ACLKE for obtaining the input commands, address and data-to-be-written (including the signal ADQINX), and outputs it to the DFF 13. In such case, the signal ACLKE may also be a signal having the same phase with the internal clock signal CLK1.

Furthermore, while the signal ENCADRV is asserted, in response to each falling edge of the clock of the internal clock signal CLK1 input by the CK buffer 17, in the falling edges of the external clock signal CK corresponding to said clock, the DCK buffer 12 generates a signal ACLKO for obtaining the input commands, address and data-to-be-written (including the signal ADQINX), and outputs it to the DFF 13. In such case, the signal ACLKO may also be a signal having the opposite phase with the internal clock signal CLK1.

Furthermore, while the signal ENCADRV is asserted, in response to each falling edge of the clock of the internal clock signal CLK1 input by the CK buffer 17, according to the external clock signal CK corresponding to said clock of the internal clock signal CLK1, the DCK buffer 12 generates a data clock signal DCLK for transmitting the input data-to-be-written (including the signal ADQINX) to the memory cell array, and outputs it to the DFF 13. In such case, the clock width of the data clock signal DCLK may be either the same with or different from the clock width of the internal clock signal CLK1.

When the chip select signal CS #is asserted, according to the external clock signal CK, the DFF 13 obtains the input data-to-be-written and sends it to the memory cell array. Moreover, the DFF 13 is configured to operate when either of the signals ENCADRV and ENDQDRV is asserted, even if the chip select signal CS #is negated (high level). Additionally, the DFF 13 is an example of a "transmission circuit" in the present invention.

Specifically, when the signal ENCADRV is asserted, the DFF 13 obtains the signal ADQINX output from the receiver 11 when receiving the signals ACLKE and ACLKO from the DCK buffer 12. Then, the DFF 13 outputs a signal ADD indicating the commands and addresses within the signal ADQINX to the command decoder 21 and a memory array control circuit 22 (described below). Additionally, when the signal ENDQDRV is asserted, as the DFF 13 obtains the signal ADQINX output from the receiver 11 when receiving the signals ACLKE and ACLKO from the DCK buffer 12, the DFF 13 parallel transforms and stores the data-to-be-written including the obtained signal ADQINX when inputting the data clock signal DCLK from the DCK buffer 12. Then, the DFF 13 outputs (i.e. transmits) the signal DQ indicating the data-to-be-written including the signal ADQINX to the memory cell array according to the data clock signal DCLK.

The receiver 14 outputs the chip select signal CS #input from the external device through the CS #terminal to the CS buffer 15 as an internal chip select signal CSINX.

When the internal chip select signal CSINX is asserted (low level), or when a first control signal CSACTB provided by the CK buffer 17 is asserted (high level), the CS buffer 15 operates. Specifically, the CS buffer 15 logically inverts the internal chip select signal CSINX received from the receiver 14, and outputs an inverted chip select signal CSACT to the CK buffer 17. Additionally, the CS buffer 15 outputs the asserted signal CSADQX to the receiver 11, and outputs an asserted signal CSCLKX for activating the receiver 16 to the receiver 16.

When inputting the asserted signal CSCLKX from the CS buffer 15, the receiver 16 outputs the external clock signal CK input from the external device through the CK terminal to the CK buffer 17 as a signal CLKX. Moreover, the external clock signal CK may be input in a fixed frequency whether the chip select signal CS #is asserted.

When inputting the asserted (high level) inverted chip select signal CSACT from the CS buffer 15, the CK buffer 17 asserts (into high level) the first control signal CSACTB and outputs it to the CS buffer 15 and the command decoder 21. Furthermore, the CK buffer 17 adopts the signal CLKX input from the receiver 16 as the internal clock signal CLK1, and outputs it to the DCK buffer 12 and the command decoder 21. The frequency of the internal clock signal CLK1 may be the same as or different from the external clock signal CK. Additionally, the frequency of the internal clock signal CLK1 may vary with time, for example, to temporarily accelerate data read or write operations.

Additionally, according to the external clock signal CK, while the first data-to-be-written (which is data-to-be-written (DE7, DO7) here) is being input, when the chip select signal CS #changes from asserted (low level) to negated (high level), the CK buffer 17 operates the DFF 13 (the transmission circuit) to transmit the data-to-be-written (DE7, DO7) to the memory cell array. Here, the CK buffer 17 is an example of a "control circuit" in the present invention.

Additionally, the first data-to-be-written may be the last data-to-be-written in the write command (which is the data-to-be-written (DE7, DO7) in the present embodiment). As such, according to the external clock signal CK, while the data-to-be-written (DE7, DO7) is being input, even if the chip select signal CS #changes from asserted (low level) to negated (high level), the data-to-be-written (DE7, DO7) may be written into the memory cells in the memory cell array due to the data-to-be-written (DE7, DO7) being able to be transmitted to the memory cell array. As such, all the data-to-be-written input in the write command may be properly written into the semiconductor memory device.

Additionally, even after the chip select signal CS #becomes negated (high level), the CK buffer 17 may operate the DFF 13 by maintaining the first control signal CSACTB for operating the DFF 13 (the transmission circuit) asserted (high level), wherein the first control signal CSACTB (a control signal) is generated based on the chip select signal CS #. As such, even when the chip select signal CS #changes from asserted to negated, the DFF 13 may be operated based on the asserted first control signal CSACTB due to the asserting (into high level) of the first control signal CSACTB.

Additionally, the internal clock signal CLK1 is generated based on the external clock signal CK. While the internal clock signal CLK1 for generating the data clock signal DCLK is asserted (high level), the CK buffer 17 may maintain the first control signal CSACTB (the control signal) asserted (high level). The data clock signal DCLK is used for transmitting the first data-to-be-written (which is the data-to-be-written (DE7, DO7) here) to the memory cell array. As such, based on the internal clock signal CLK1, the DFF 13 may be operated when generating the data clock signal DCLK for transmitting the data-to-be-written (DE7, DO7) to the memory cell array. According to the generated internal clock signal CLK1, the data-to-be-written (DE7, DO7) may be transmitted to the memory cell array.

Additionally, during the period between the chip select signal CS #changing from asserted (low level) to negated (high level) and the next asserted, the CK buffer 17 ends the operation of the DFF 13 (the transmission circuit). As such, the DFF 13 may be reset before the next assertion of the chip select signal CS #(i.e. the start of next read or write operation).

Next, the configuration of the control logic part 20 is described. The control logic part 20 includes the command decoder 21 and the memory array control circuit 22. Moreover, to simplify the description, the other well-known configurations in the control logic part 20 (e.g. a circuit controlling the update operation of the memory cells) are not shown.

When inputting the asserted (high level) first control signal CSACTB from the CK buffer 17, during the period between the rising edge of a particular clock (which is the first clock in the example shown in FIG. 4) and the falling edge of a particular clock (which is the third clock in the example shown in FIG. 4) of the internal clock signal CLK1 input from the CK buffer 17, the command decoder 21 outputs the asserted (high level) signal ENCADRV to the DCK buffer 12. Additionally, when the asserted first control signal CSACTB is input from the CK buffer 17, during the period between the rising edge of a particular clock (which is the sixth clock in the example shown in FIG. 4) and the falling edge of a particular clock (which is the seventh clock in the example shown in FIG. 4) of the internal clock signal CLK1, the command decoder 21 outputs the asserted (high level) signal ENDQDRV to the DCK buffer 12.

Additionally, after identifying all the input row addresses based on the signal ADD input from the DFF 13, when the clock (which is the third clock in the example shown in FIG. 4) of the internal clock signal CLK1 is input, the command decoder 21 asserts (into high level) a row control signal RAS for activating the selected word line by the input row address, and outputs it to the memory array control circuit 22.

Figure 4:
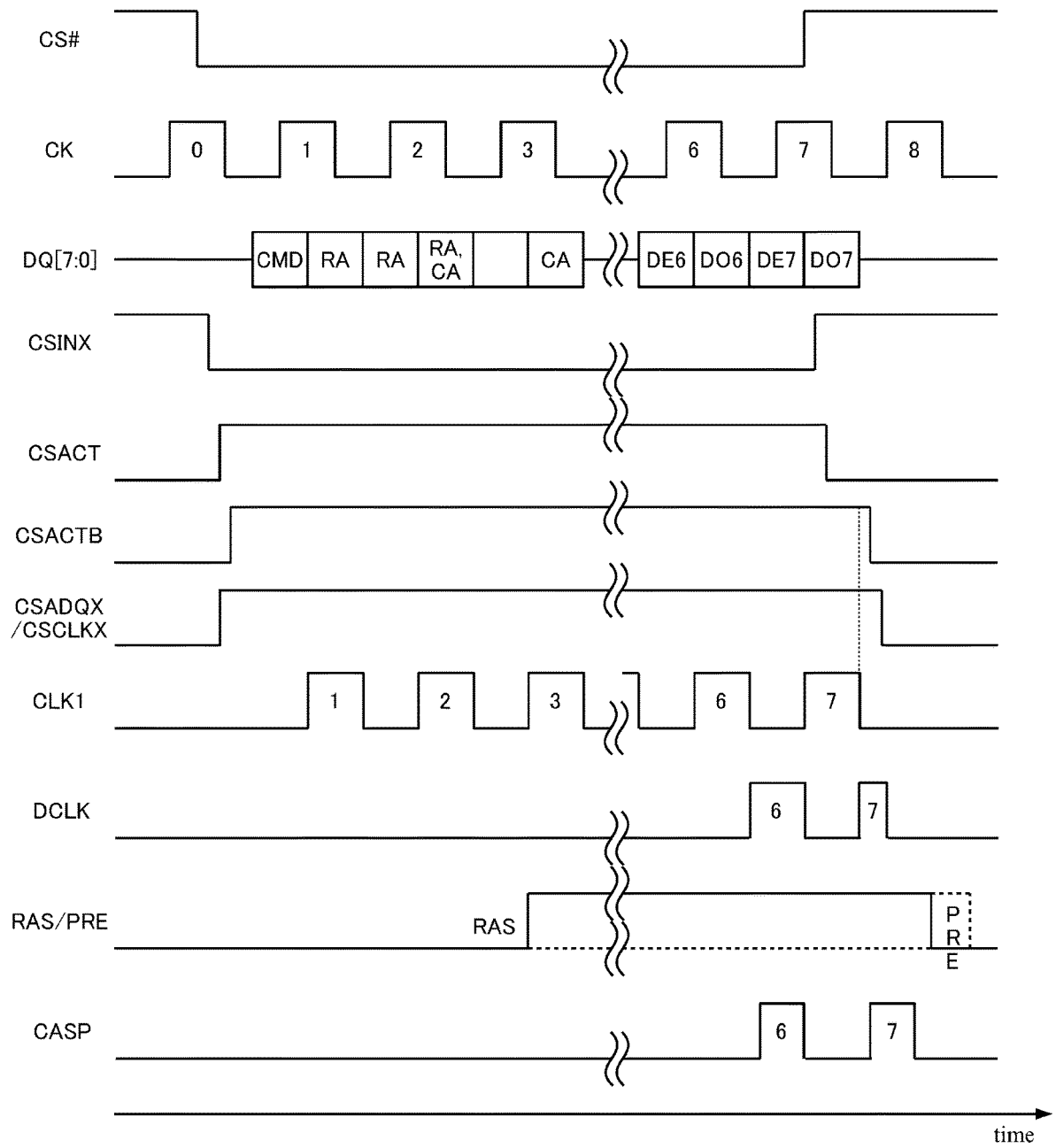
FIG. 4 shows a timing diagram of the variation of signals in a semiconductor memory device when a write command is input.

Furthermore, during the falling edge of the particular clocks (which are the sixth and seventh clocks respectively in the example shown in FIG. 4) of the internal clock signal CLK1, according to the external clock signal CK corresponding to said clock, the command decoder 21 asserts (into high level) a column control signal CASP for selecting the input data-to-be-written to be written into bit lines of the memory array, and outputs it to the memory array control circuit 22. Here, the bit lines of the memory cells are selected based on the column addresses of the signal ADD input from the DFF 13.

Additionally, when the negated (low level) first control signal CSACTB is input from the CK buffer 17, during the falling edge of the clock (which is the seventh clock in the example shown in FIG. 4) of the column control signal CASP, the command decoder 21 asserts (into high level) a precharge signal PRE and outputs it to the memory array control circuit 22, and, at the same time, negates (into low level) the row control signal RAS. The column control signal CASP is used for selecting the bit lines of the memory cells into which the last data-to-be-written (which is the data-to-be-written (DE7, DO7) in the example shown in FIG. 4) is written.

Furthermore, after particular precharge time duration, the command decoder 21 negates (into low level) the signal PRE, ends the operation, and transfers to a standby state.

Based on the signal ADD input from the DFF 13 and the row control signal RAS, column control signal CASP and the signal PRE input from the command decoder 21, the memory array control circuit 22 controls the commands, addresses and data for the memory cell array. Furthermore, due to the details of the controlling of the commands, addresses and data for the memory cell array being the same as well-known techniques, the description thereof is omitted in the present embodiment.

Figure 3:
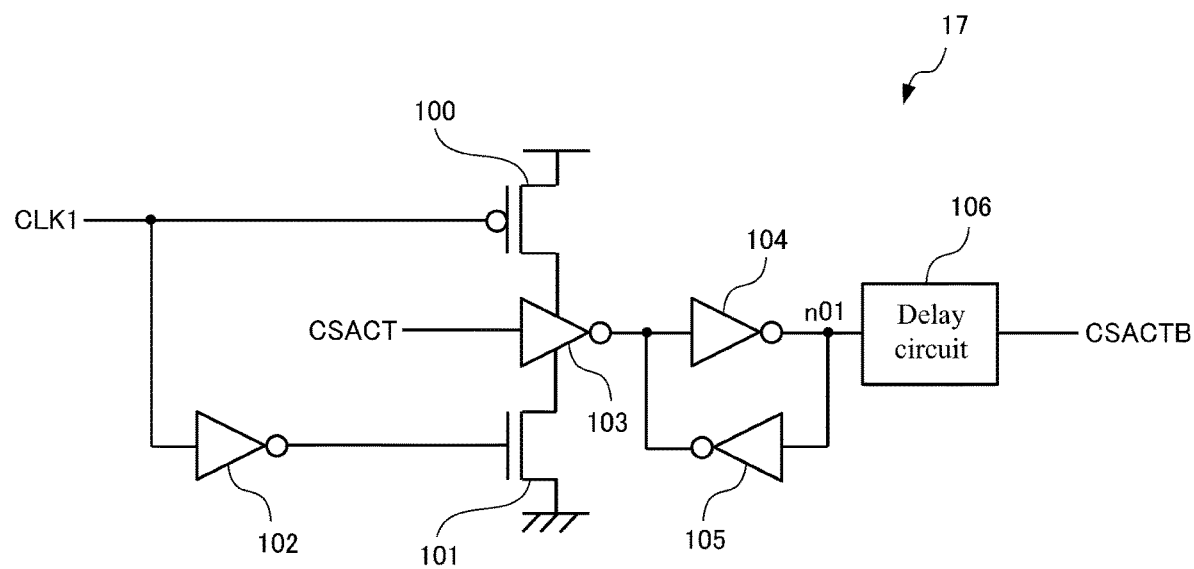
FIG. 3 (a) shows a configuration schematic diagram of part of a clock (CK) buffer, and FIG. 3 (b) shows a timing diagram of the variation with time of signals in part of a CK buffer.
Figure 3:
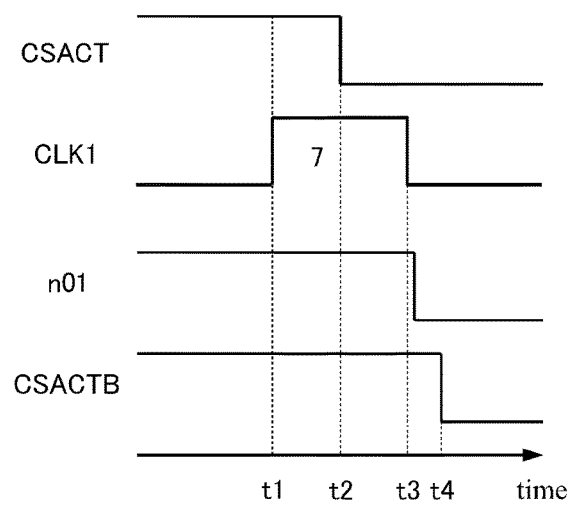

Next, referring to FIG. 3, the configuration and operation of part of the CK buffer 17 is described. Referring to FIG. 3 (*a*), a CK buffer 17 of an embodiment of the present invention includes a P-channel metal-oxide-semiconductor field effect transistor (MOSFET) 100, an N-channel MOSFET 101, four inverters 102, 103, 104, 105 and a delay circuit 106.

The source of the P-channel MOSFET 100 is connected to a high-voltage power source, and the drain of the MOSFET 100 is connected to the high-voltage power source side of the inverter 103. The internal clock signal CLK1 is input into the gate of the MOSFET 100.

The drain of the N-channel MOSFET 101 is connected to the low-voltage power source side of the inverter 103. The source of the MOSFET 101 is connected to a low-voltage power source. The gate of the MOSFET 101 is connected to an output terminal of the inverter 102.

The internal clock signal CLK1 is input to an input terminal of the inverter 102. The inverter 102 logically inverts the input internal clock signal CLK1, and outputs the logically inverted signal to the gate of the MOSFET 101.

The inverted chip select signal CSACT is input to an input terminal of the inverter 103. The output terminal of the inverter 103 is connected to an input terminal of the inverter 104. When the respective MOSFET 100 and MOSFET 101 are turned on, the inverter 103 is operated. Specifically, the inverter 103 logically inverts the inverted chip select signal CSACT, and outputs the logically inverted signal to the inverter 104.

The input terminal of the inverter 104 is connected to the output terminal of the inverter 103. The output terminal of the inverter 104 is connected to the delay circuit 106. The inverter 104 logically inverts the signal output from the inverter 103, and outputs the logically inverted signal to the delay circuit 106.

The input terminal of the inverter 105 is connected to a node n01 between the inverter 104 and the delay circuit 106. Additionally, the output terminal of the inverter 105 is connected to a node between the inverter 103 and the inverter 104. The inverter 105 logically inverts the signal output from the inverter 104, and outputs the logically inverted signal to the inverter 104.

The delay circuit 106 delays the signal output from the inverter 104 for particular time duration, and outputs the delayed signal to the CS buffer 15 and the command decoder 21 as the first control signal CSACTB.

Next, referring to FIG. 3 (*b*), the operation of the part of the CK buffer 17 shown in FIG. 3 (*a*) is described. In the present embodiment, while the clock (the seventh clock) for inputting the data-to-be-written (DE7, DO7) shown in FIG. 4 is asserted, the chip select signal CS #changes from asserted (low level) to negated (high level). First, when the inverted chip select signal CSACT is asserted (high level) and the internal clock signal CLK1 is negated (low level), the inverted chip select signal CSACT is input into the delay circuit 106 through the inverters 103 and 104. Then, the signal input into the delay circuit 106 is delayed and output from the delayed circuit 106 as the asserted (high level) first control signal CSACTB.

Subsequently, when the seventh clock of the external clock signal CK is asserted (high level), at time t1, the seventh clock of the internal clock signal CLK1 is asserted (high level). In such case, due to the respective MOSFET 100 and MOSFET 101 become the cut-off state, the operation of the inverter 103 is stopped, and the voltage of the output terminal of the inverter 103 is maintained at a low level. As such, the first control signal CSACTB output from the delay circuit 106 is maintained asserted (high level).

Then, at time t2, while the seventh clock of the external clock signal CK is asserted, when the chip select signal CK #changes from asserted (low level) to negated (high level), the inverted chip select signal CSACT changes from asserted to negated (low level). Here, due to the seventh clock of the internal clock signal CLK1 being maintained asserted (high level), the respective MOSFET 100 and MOSFET 101 are maintained at the cut-off state. Thus, the first control signal CSACTB that is maintained asserted is output from the delay circuit 106.

As such, the internal clock signal CLK1 is generated based on the external clock signal CK, while the internal clock signal CLK1 for generating the data clock signal DCLK is asserted, the CK buffer 17 maintains the first control signal CSACTB asserted. The data clock signal DCLK is a signal for transmitting the data-to-be-written (DE7, DO7) to the memory cell array.

Furthermore, based on the first control signal CSACTB output from the delay circuit 106, the command decoder 21 outputs the asserted signal ENDQDRV. Additionally, the DCK buffer 12 generates the data clock signal DCLK for transmitting the data-to-be-written (DE7, DO7) to the memory cell array, and outputs it to the DFF 13. Moreover, the DFF 13 obtains the signal ADQINX according to the input of the signal ACLKE, the signal ACLKO and the data clock signal DCLK, and outputs (i.e. transmits) the signal DQ indicating the data-to-be-written including the signal ADQINX to the memory cell array.

As such, even if the chip select signal CS #becomes negated (high level), the CK buffer 17 may still operate the DFF 13 by maintaining the first control signal CSACTB for operating the DFF 13 asserted (high level), wherein the first control signal CSACTB is generated based on the chip select signal CS #.

Moreover, accordingly, according to the external clock signal CK, while the data-to-be-written (DE7, DO7) is being input, when the chip select signal CS #changes from asserted (low level) to negated (high level), the CK buffer 17 operates the DFF 13 to transmit the data-to-be-written (DE7, DO7) to the memory cell array.

Subsequently, at time t3, when the seventh clock of the internal clock signal CLK1 changes from asserted (high level) to negated (low level), the respective MOSFET 100 and MOSFET 101 change to the turn-on state. In such case, the inverter 103 logically inverts the negated (low level) inverted chip select signal CSACT and outputs the logically inverted signal. Then, the signal output from the inverter 103 is input into the delay circuit 106 through the inverter 104. Then, the signal input into the delay circuit 106 is delayed, and the negated (low level) first control signal CSACTB is output from the delay circuit 106 at time t4. Here, based on the first control signal CSACTB output from the delay circuit 106, the command decoder 21 outputs the negated (low level) signal ENDQDRV. As such, the operation of the DCK buffer 12 is ended, and the operation of the DFF 13 is subsequently ended.

In an embodiment, the delay time of the delay circuit 106 may be arbitrarily set, for example, it may be set as smaller than the negate persistent time (e.g. the tCSHI in the specification of HyperBus™ interface) of the chip select signal CS #between read or write operations of the semiconductor memory device. In such case, during the period between the chip select signal CS #changing from asserted to negated and the next asserted, the CK buffer 17 may end the operation of the DFF 13.

FIG. 4 shows a timing diagram of the variation of the signals in the semiconductor memory device when the write command is input. First, when the chip select signal CS #changes from negated (high level) to asserted (low level), by asserting (into low level) the internal chip select signal CSINX, the CS buffer 15 starts operating. Here, by asserting (into high level) the inverted chip select signal CSACT, the CK buffer 17 starts operating (i.e. being enabled or activated). Additionally, when the signals CSADQX and CSCLKX are asserted (high level), the receivers 11 and 16 start operating. Moreover, by asserting (high level) the first control signal CSACTB, the command decoder 21 starts operating. According to the aforementioned operations, the DCK buffer 12, the DFF 13 and the memory array control circuit 22 start operating.

Subsequently, the command (CMD), the row addresses (RA) and the column addresses (CA) are input between the rising edge of the first clock and the falling edge of the third clock of the external clock signal CK. Then, at the falling edge of the second clock of the external clock signal CK, when all the row addresses are input, in response to the rising edge of the third clock of the internal clock signal CLK1 generated according to the external clock signal CK, the row control signal RAS is asserted. The row control signal RAS is a signal for activating the word line selected by the input row addresses. As such, the selected word line is activated by the input row addresses.

Subsequently, between the rising edge and falling edge of the sixth clock of the external clock signal CK, the data-to-be-written (DE6, DO6) is input. Then, in response to the falling edge of the sixth clock of the internal clock signal CLK1, the clock (the sixth clock) of the data clock signal DCLK is asserted, wherein the data clock signal DCLK is a signal for transmitting the data-to-be-written (DE6, DO6) input by the sixth clock of the external clock signal CK to the memory cell array. According to said clock, the data-to-be-written (DE6, DO6) is transmitted to the memory cell array.

Then, after the sixth clock of the internal clock signal CLK1 is negated (low level), the clock (the sixth clock) of the column control signal CASP is asserted (high level), wherein the column control signal CASP is a signal for selecting the bit line of the memory cells to write the data-to-be-written (DE6, DO6) into, and activating the bit line selected by the column addresses. As such, by the sixth clock of the external clock signal CK, the input data-to-be-written (DE6, DO6) is written into the memory cells.

Subsequently, between the rising edge and falling edge of the seventh clock of the external clock signal CK, the data-to-be-written (DE7, DO7) is input. Here, while the seventh clock of the external clock signal CK is asserted (high level), when the chip select signal CS #changes from asserted (low level) to negated (high level), the internal chip select signal CSINX is negated (high level), and the inverted chip select signal CSACT is subsequently negated (low level).

Also, as described referring to FIG. 3 (*b*), after the chip select signal CS #changes from asserted (low level) to negated (high level), the first control signal CSACTB may remain asserted (high level), so as to allow the signals CSADQX and CSCLKX to remain asserted (high level) as well. In cases such as this, the receivers 11 and 16, the DCK buffer 12, the DFF 13, the CS buffer 15, the CK buffer 17, the command decoder 21 and the memory array control circuit 22 continue operating. As such, the clock (the seventh clock) of the data clock signal DCLK is asserted (high level) at the falling edge of the seventh clock of the internal clock signal CLK1, wherein the data clock signal DCLK is a signal for transmitting the data (DE7, DO7) input by the seventh clock of the external clock signal CK to the memory cell array. The input data (DE7, DO7) is transmitted to the memory cell array by the asserted data clock signal DCLK.

Then, after the seventh clock of the internal clock signal CLK1 is negated (low level), the clock (the seventh clock) of the column control signal CASP is asserted (high level), wherein the column control signal CASP is a signal for selecting the bit line of the memory cells to write the data-to-be-written (DE7, DO7) into, and activating the bit line selected by the column addresses. As such, the data-to-be-written (DE7, DO7) input by the seventh clock of the external clock signal CK is written into the memory cells.

Furthermore, after specific time duration of the seventh clock of the internal clock signal CLK1 being negated (low level), the first control signal CSACTB is negated (low level), so as to negate (into low level) the signals CSADQX and CSCLKX. Accordingly, the receivers 11 and 16, the DCK buffer 12, the DFF 13, the CS buffer 15 and the CK buffer 17 end operations.

Also, at the falling edge of the seventh clock of the column control signal CASP, the precharge signal PRE is asserted (high level), and the row control signal RAS is negated (low level). Then, after a specific precharge period, the signal PRE is negated (low level). Here, the command decoder 21 and the memory array control circuit 22 end operations.

As such, according to the external clock signal CK, while the data-to-be-written (DE7, DO7) is being input, when the chip select signal CS #changes from asserted (low level) to negated (high level), the data-to-be-written (DE7, DO7) may be transmitted to the memory cell array, and the data-to-be-written (DE7, DO7) may be written into the memory cells in the memory cell array.

As described above, in accordance with the semiconductor memory device regarding the present embodiment, according to the external clock signal CK, while the data-to-be-written (DE7, DO7) (first data-to-be-written) is being input, even if the chip select signal CS #changes from asserted (low level) to negated (high level), the data-to-be-written (DE7, DO7) may still be transmitted to the memory cell array, and the data-to-be-written (DE7, DO7) may be written into the memory cells in the memory cell array. As such, even if the semiconductor memory device is deactivated during the data write operation, the data may still be properly written into the semiconductor memory device.

Also, in accordance with the semiconductor memory device regarding the present embodiment, whether the chip select signal CS #is asserted (low level), even if the external clock signal CK is input at a fixed frequency, the data-to-be-written (DE7, DO7) (the first data-to-be-written) may be transmitted to the memory cell array, and the data-to-be-written (DE7, DO7) may be written into the memory cells in the memory cell array. Additionally, in accordance with the semiconductor memory device regarding the present embodiment, the providing timing of the external clock signal from the external device to the semiconductor memory device is not limited (for example, the increasing or decreasing of the interval between two successive clocks of the external clock signal is not needed). Due to the external clock signal being allowed to be provided to the semiconductor memory device at a fixed frequency, the semiconductor memory device with higher operability may be thus realized.

In the following description, Embodiment 2 of the present invention is described. The difference between the semiconductor memory device of the present embodiment and that of Embodiment 1 is that the CK buffer 17 (the control circuit) operates the DFF 13 (the transmission circuit) until the data-to-be-written (DE7, DO7) (the first data-to-be-written) is written into any of the memory cells in the memory cell array. In the following description, a configuration different from Embodiment 1 is described.

Figure 5:
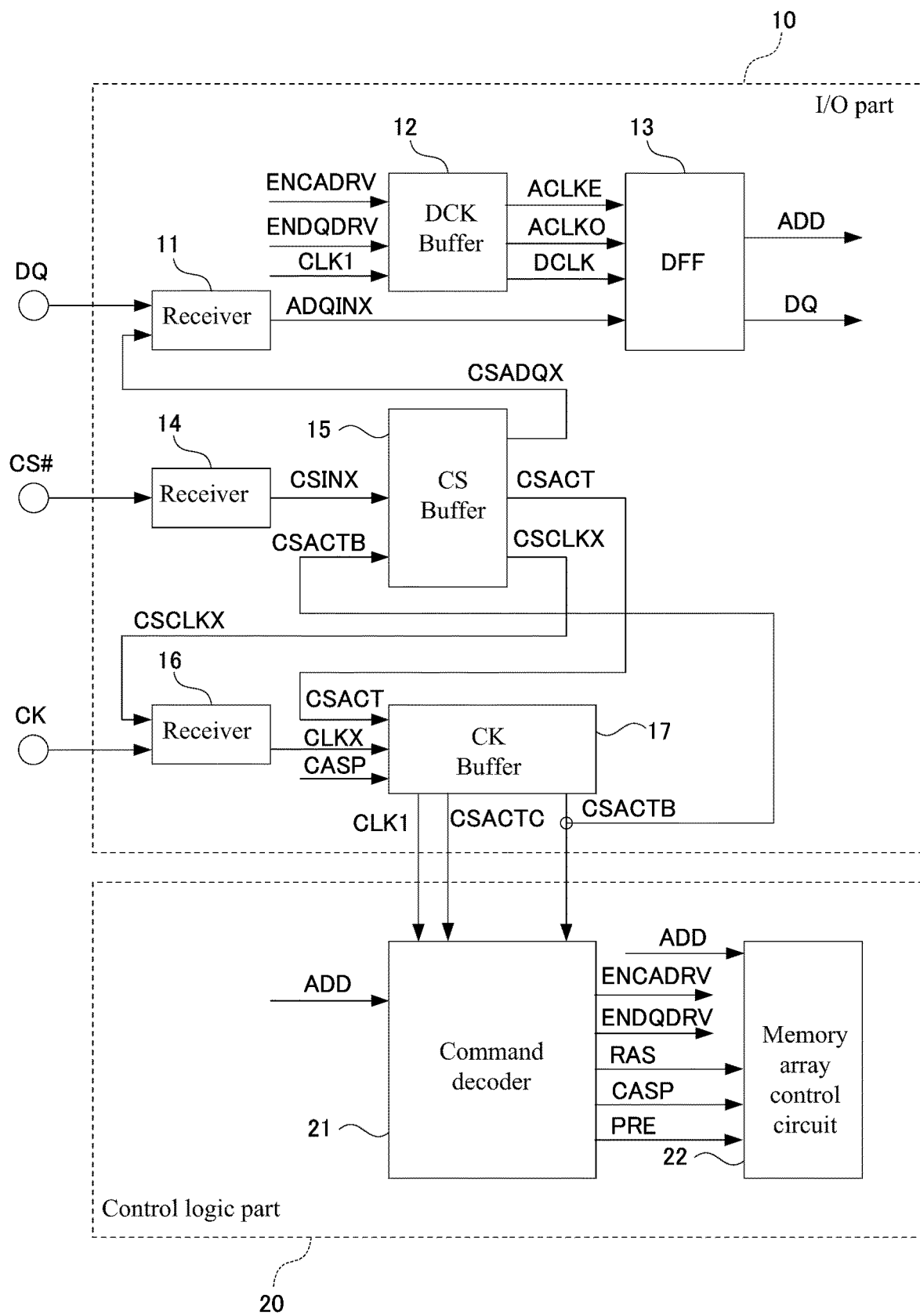
FIG. 5 shows a configuration block diagram of the I/O part and the control logic part of the semiconductor memory device regarding Embodiment 2 of the present invention.

FIG. 5 shows a configuration block diagram of the I/O part and the control logic part 20 of the semiconductor memory device regarding the present embodiment. In the example shown in FIG. 5, a second control signal CSACTC (a control signal) is generated based on the chip select signal CS #, and the second control signal CSACTC for operating the DFF 13 is input from the CK buffer 17 to the command decoder 21.

When the asserted (high level) inverted chip select signal CSACT is input from the CS buffer 15, the CK buffer 17 asserts (into high level) the first control signal CSACTB, and outputs it to the CS buffer 15 and the command decoder 21. Additionally, in the present embodiment, when the asserted (high level) inverted chip select signal CSACT is input from the CS buffer 15, the CK buffer 17 asserts (into high level) the second control signal CSACTC, and outputs it to the command decoder 21.

Moreover, in the present embodiment, during the assertion (high level) of the column control signal CASP for selecting the bit line to write the data-to-be-written (DE7, DO7) (the first data-to-be-written) into, the CK buffer 17 operates the DFF 13 (the transmission circuit). As such, due to the DFF 13 being operable during the assertion (high level) of the column control signal CASP for selecting the bit line to write the data-to-be-written (DE7, DO7) (the first data-to-be-written) into, the data-to-be-written (DE7, DO7) may be further properly transmitted to the memory cell array.

In the present embodiment, when the asserted (high level) first control signal CSACTB or the asserted (high level) second control signal CSACTC is input from the CK buffer 17, at the period between the rising edge of a particular clock (which is the first clock here) and the falling edge of a particular clock (which is the third clock here) of the internal clock signal CLK1 input from the CK buffer 17, the command decoder 21 outputs the asserted (high level) signal ENCADRV to the DCK buffer 12. Also, when the asserted (high level) first control signal CSACTB or the asserted (high level) second control signal CSACTC is input from the CK buffer 17, at the period between the rising edge of a particular clock (which is the sixth clock here) and the falling edge of a particular clock (which is the seventh clock here) of the internal clock signal CLK1 input from the CK buffer 17, the command decoder 21 outputs the asserted (high level) signal ENDQDRV to the DCK buffer 12.

Figure 6:
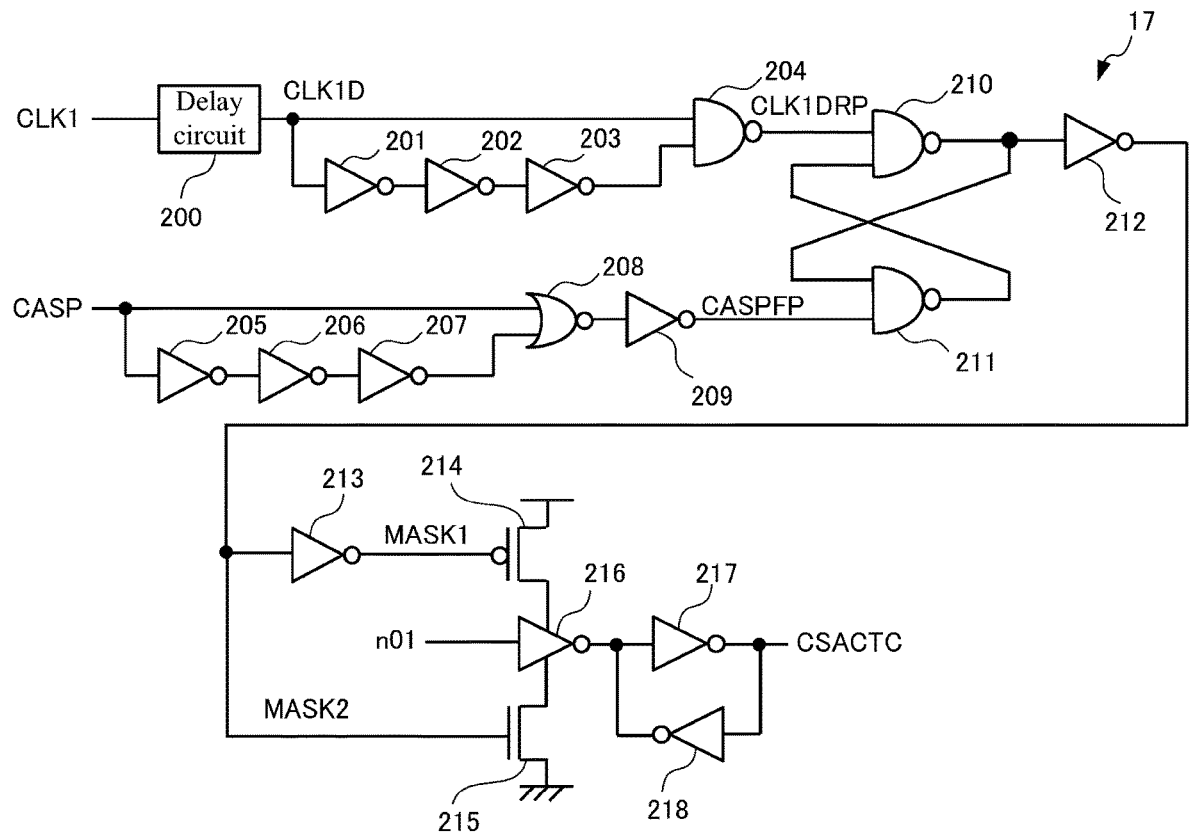
FIG. 6 (*a*) shows a configuration schematic diagram of part of a clock (CK) buffer, and FIG. 6 (*b*) shows a timing diagram of the variation with time of signals in part of a CK buffer.
Figure 6:
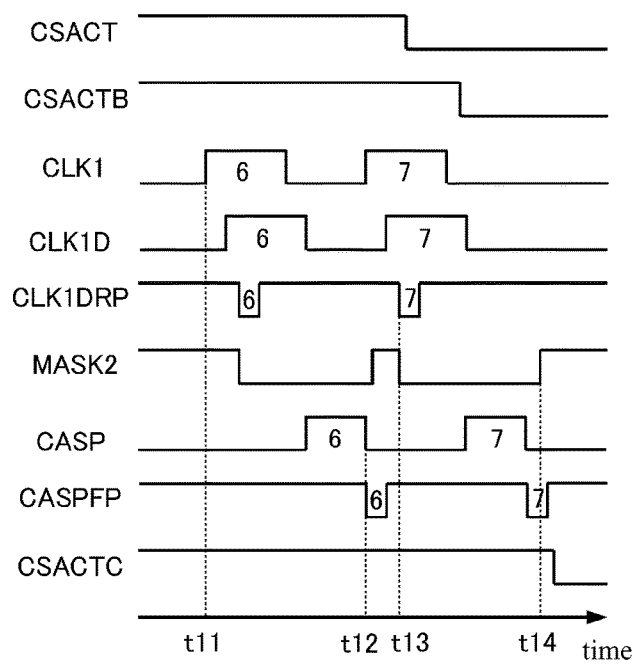

Next, referring to FIG. 6 (a), the CK buffer 17 includes a delay circuit 200 serially connected to three inverters 201, 202 and 203, a NAND circuit 204 serially connected to three inverters 205, 206 and 207, a NOR circuit 208, an inverter 209, an RS flip-flop composed of two NAND circuits 210 and 211, two inverters 212 and 213, a P-channel MOSFET 214, an N-channel MOSFET 215, and three inverters 216, 217 and 218.

The internal clock signal CLK1 is input to the delay circuit 200. The delay circuit 200 delays the input internal clock signal CLK1 with specific time duration, and outputs a delayed signal CLK1D to the NAND circuit 204 and the inverter 201.

The input terminal of the inverter 201 is connected to a node between the delay circuit 200 and the NAND circuit 204. Also, the inverter 203 logically inverts the signal input through the inverters 201 and 202, and outputs the logically inverted signal to the NAND circuit 204.

The signal CLK1D output from the delay circuit 200 is input to an input terminal of the NAND circuit 204. Also, the signal output from the inverter 203 is input to the other input terminal of the NAND circuit 204. Additionally, the NAND circuit 204 performs NAND operation based on the input signals, and outputs a signal CLKDRP to the NAND circuit 210 as the operation result.

The column control signal CASP is input to the input terminal of the inverter 205. Also, the inverter 207 logically inverts the signal input through the inverters 205 and 206, and outputs the logically inverted signal to the NOR circuit 208.

The column control signal CASP is input to an input terminal of the NOR circuit 208. Also, the signal output from the inverter 207 is input to the other input terminal of the NOR circuit 208. Additionally, the NOR circuit 208 performs NOR operation based on the input signals, and outputs the operation result to the inverter 209.

The inverter 209 logically inverts the signal input from the NOR circuit 208, and outputs the logically inverted signal to the NAND circuit 211 as a signal CASPFP.

The signal CLK1DRP output from the NAND circuit 204 is input to an input terminal of the NAND circuit 210 of the RS flip-flop. Also, the other input terminal of the NAND circuit 210 is connected to the output terminal of the NAND circuit 211. Additionally, the output terminal of the NAND circuit 210 is connected to the input terminal of the inverter 212 and an input terminal of the NAND circuit 211. Furthermore, the signal CASPFP output from the inverter 209 is input to the other input terminal of the NAND circuit 211.

The inverter 212 logically inverts the signal output from the NAND circuit 210, and outputs the logically inverted signal to the inverter 213 and the MOSFET 215 as a signal MASK2.

The inverter 213 logically inverts the signal MASK2 output from the inverter 212, and outputs the logically inverted signal to the MOSFET 214 as a signal MASK1.

Furthermore, the configuration of the MOSFETs 214, 215 and the three inverters 216, 217 and 218 makes the signal MASK1 be input to the gate of the MOSFET 214 and the signal MASK2 be input to the gate of the MOSFET 215. The configuration is identical to that of the MOSFETs 100, 101 and the three inverters 103, 104 and 105 shown in FIG. 3 (a) except that the signal at the node n01 is input to the inverter 216 and that the second control signal CSACTC is output from the inverter 217.

Referring to FIG. 6 (b), first, when the inverted chip select signal CSACT is asserted (high level), the internal clock signal CLK1 is negated (low level) and the column control signal CASP is negated (low level), the signal MASK1 changes to low level and the signal MASK2 changes to high level. As such, the inverter 216 logically inverts the signal input from the node n01, and outputs the logically inverted signal to the inverter 217. Additionally, the inverter 217 logically inverts the input signal, and outputs the logically inverted signal as the asserted (high level) second control signal CSACTC.

Subsequently, when the sixth clock of the external clock signal CK is asserted (high level), at time t11, the sixth clock of the internal clock signal CLK1 is asserted (high level). Then, the signal CLK1D is asserted (high level), and the signal CLK1DRP is changed to low level. Here, by setting the RS flip-flop, the signal MASK1 changes to high level and the signal MASK2 changes to low level. In such case, due to the respective MOSFET 214 and MOSFET 215 changes to the cut-off state, the operation of the inverter 216 is stopped, and the voltage level at the output terminal of the inverter 216 remains at a low level. As such, the second control signal CSACTC remains asserted (high level).

Subsequently, after particular time duration of the falling edge of the sixth clock of the internal clock signal CLK1, the clock (the sixth clock) of the column control signal CASP is asserted (high level). As such, the data-to-be-written (DE6, DO6) input by the sixth clock of the external clock signal CK is written into the memory unit. Then, when the clock (the sixth clock) of the column control signal CASP is negated (low level), at time t12, the signal CASPFP changes to low level. Here, by resetting the RS flip-flop, the signal MASK1 changes to low level and the signal MASK2 changes to high level. In such case, the respective MOSFET 214 and MOSFET 215 change to the turn-on state, and the inverter 216 logically inverts the signal input from the node n01 and outputs the logically inverted signal to the inverter 217. Here, due to the logic level of the signal at the node n01 being the same as the logic level of the first control signal CSACTB (which is high level here), the second control signal CSACTC remains asserted (high level).

Subsequently, at time t13, based on the assertion (high level) of the seventh clock of the internal clock signal CLK1, the signal CLK1DRP changes to low level. In such case, as described above, based on the resetting of the RS flip-flop, the respective MOSFET 214 and MOSFET 215 change to the cut-off state. As such, the second control signal CSACTC remains asserted (high level).

Subsequently, while the seventh clock of the internal clock signal CLK1 is asserted (high level), when the inverted chip select signal CSACT changes from asserted (high level) to negated (low level), after the seventh clock of the internal clock signal CLK1 has been asserted (high level) for a particular amount of time, the first control signal CSACTB is negated (low level).

Then, after the falling edge of the seventh clock of the internal clock signal CLK1 for a particular amount of time, the clock (the seventh clock) of the column control signal CASP is asserted (high level). As such, the data-to-be-written (DE7, DO7) input by the seventh clock of the external clock signal CK is written into the memory cells. Then, when the clock (the seventh clock) of the column control signal CASP is negated (low level), at time t14, the signal CASPFP changes to low level. Here, by resetting the RS flip-flop, the signal MASK1 changes to low level and the signal MASK2 changes to high level. In such case, the respective MOSFET 214 and MOSFET 215 change to the turn-on state, and the inverter 216 logically inverts the signal input from the node n01 and outputs the logically inverted signal to the inverter 217. Here, due to the logic level of the signal at the node n01 being the same as the logic level of the first control signal CSACTB (which is low level here), the second control signal CSACTC is negated (low level).

Here, due to the first control signal CSACTB and the second control signal CSACTC are negated (low level) respectively, the control decoder 21 outputs the negated (low level) signal ENDQDRV. As such, the operation of the DCK buffer 12 is ended, and the operation of DFF 13 is ended subsequently.

In this manner, while the column control signal CASP for selecting the bit line of the memory cells for the data-to-be-written (DE7, DO7) to be written into is asserted, the CK buffer 17 may operate the DFF 13.

Additionally, according to the external clock signal CK, while the data-to-be-written (DE7, DO7) is being input, even if the chip select signal CS #changes from asserted (low level) to negated (high level), the CK buffer 17 may operate the DFF 13 until the data-to-be-written (DE7, DO7) is written into any of the memory cells in the memory cell array.

Furthermore, in the present embodiment, it should be noted that the delay time of the delay circuit 200 must be set, so as to alternately set and reset the RS flip-flop (i.e. the clock (e.g. the sixth clock) of the column control signal CASP generated based on the clock (e.g. the sixth clock) of the internal clock signal CLK1 is negated (low level) before asserting (high level) the next clock (e.g. the seventh clock) of the delayed signal CLK1D of the internal clock signal CLK1).

Figure 7:
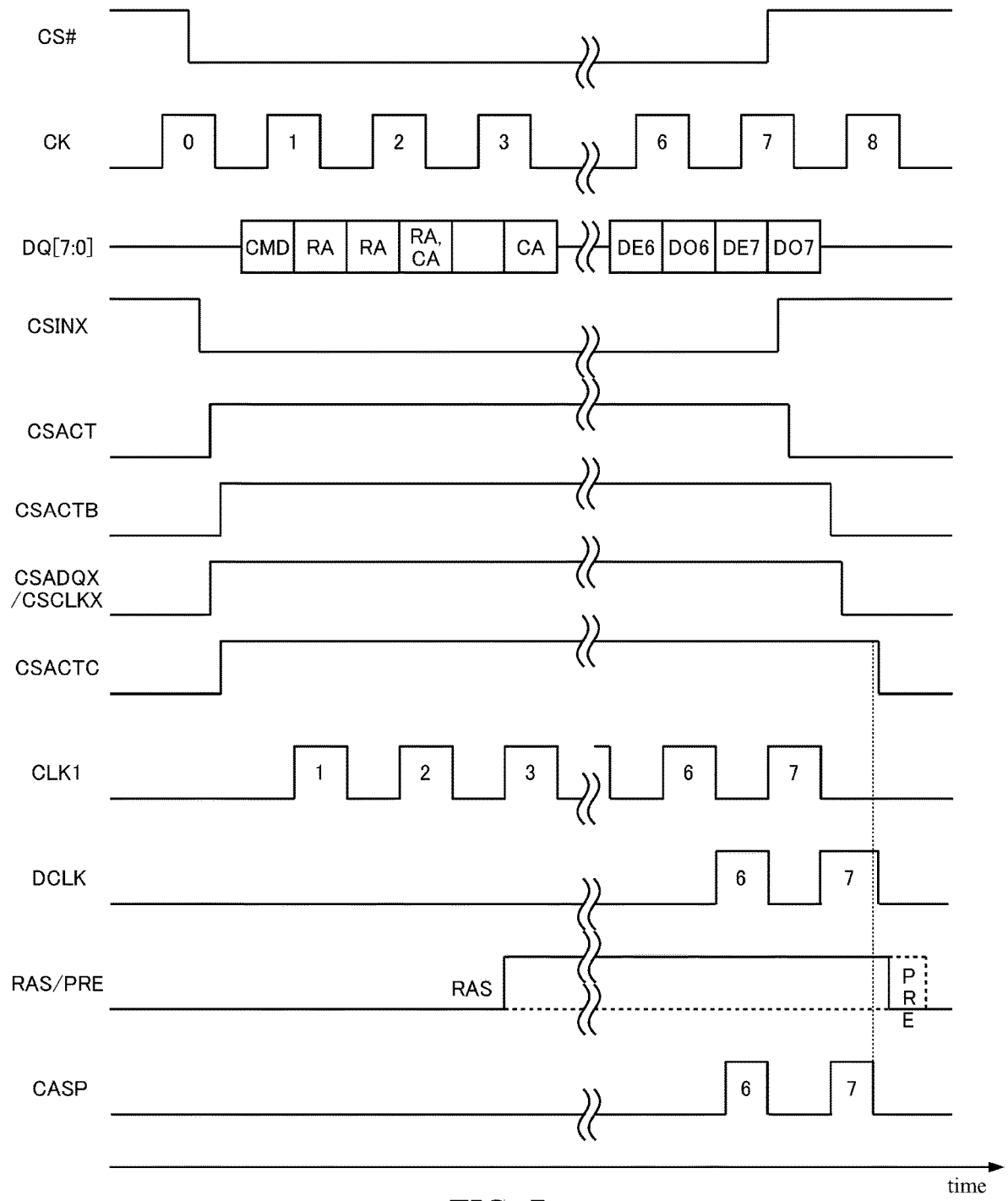
FIG. 7 shows a timing diagram of the variation with time of signals in a semiconductor memory device when a write command is input.

FIG. 7 shows a timing diagram of the variation with time of the signals in the semiconductor memory device of the present embodiment when the write command is input. Here, the part different from the timing diagram shown in FIG. 4 is described.

First, when the chip select signal CS #changes from negated (high level) to asserted (low level), the internal chip select signal CSINX is asserted (low level) and the inverted chip select signal CSACT is asserted (high level). As such, the first control signal CSACTB and the second control signal CSACTC are asserted (high level).

Here, as described referring to FIG. 6 (b), at the period until the negation (low level) of the clock (the seventh clock) of the column control signal CASP for selecting the bit line of the memory cells for the data-to-be-written (DE7, DO7) to be written into), the second control signal CSACTC remains asserted (high level). In such case, as shown in FIG. 7, due to the assert (high level) state of the second control signal CSACTC being longer than the assert (high level) state of the first control signal CSACTB, the asserted second control signal CSACTC is adopted to allow the DCK buffer 12 and the DFF 13 operate for a longer time. As such, compared to Embodiment 1, due to the width of the seventh clock of the data clock signal DCLK being increased, the data-to-be-written (DE7, DO7) may be further properly transmitted to the memory cell array.

As described above, in accordance with the semiconductor memory device regarding the present embodiment, due to the DFF 13 (transmission circuit) being operable until the data-to-be-written (DE7, DO7) (the first data-to-be-written) is written into the memory cells, the data-to-be-written (DE7, DO7) (the first data-to-be-written) may be further properly transmitted to the memory cell array.

In the following description, an alternative embodiment of Embodiment 2 is described. The present alternative embodiment is different from Embodiment 2 in that the CK buffer 17 (the control circuit) may operate the DFF 13 (transmission circuit) by the data-to-be-written (DE7, DO7) (the first data-to-be-written) being written into any memory cell, until the number of data-to-be-written written into any memory cell in the write command reaches the number of data-to-be-written input by the write command. In the following description, the configuration that differs from Embodiment 2 is described.

Figure 8:
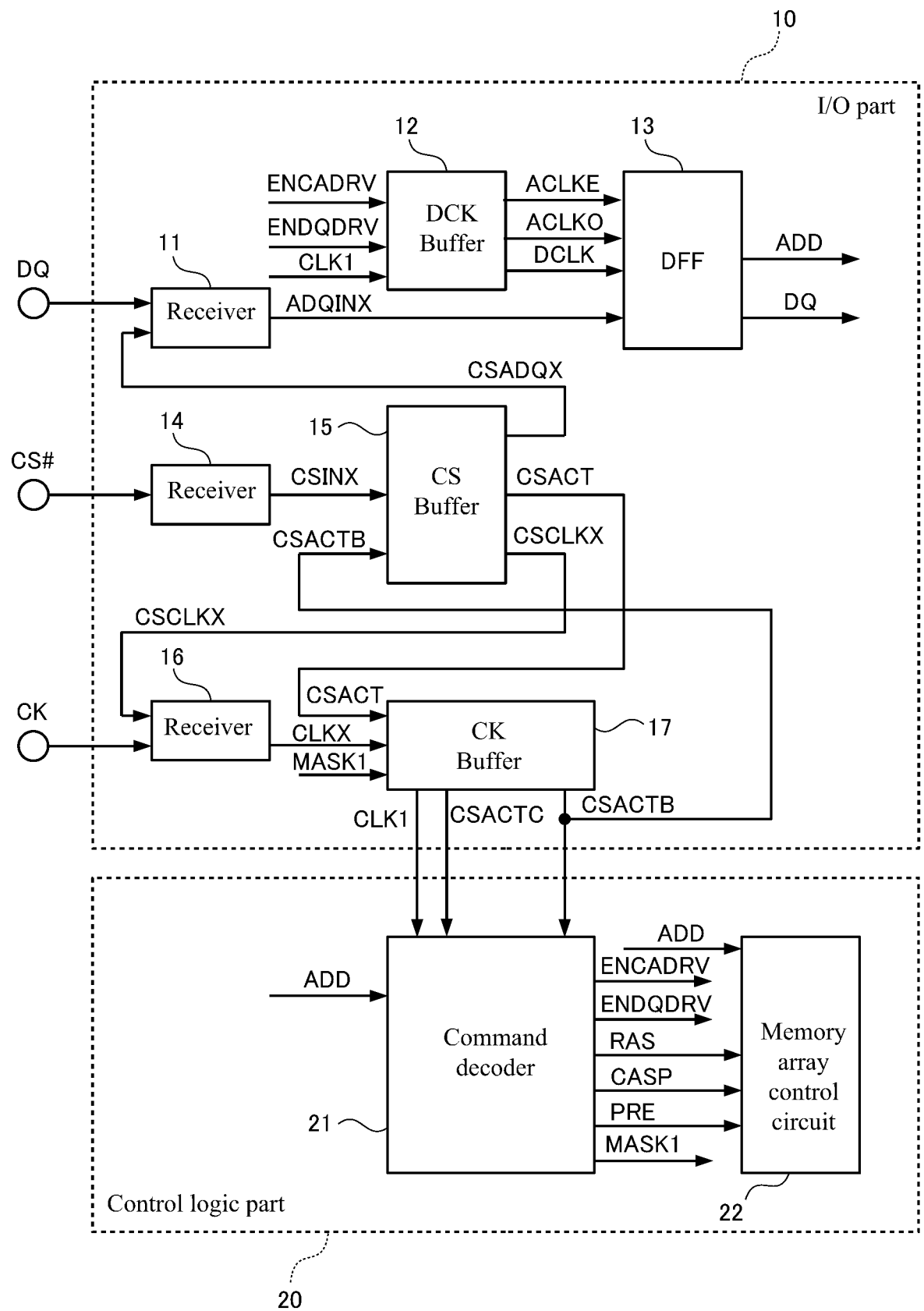
FIG. 8 shows a configuration block diagram of the I/O part and the control logic part of the semiconductor memory device regarding an alternative embodiment of the present invention.

FIG. 8 shows a configuration diagram of the I/O part 10 and the control logic part 20 of the semiconductor memory device regarding the alternative embodiment of the present invention. In the example shown in FIG. 8, the CK buffer 17 is configured to output the second control signal CSACTC based on the signal MASK1 input from the command decoder 21.

Figure 9:
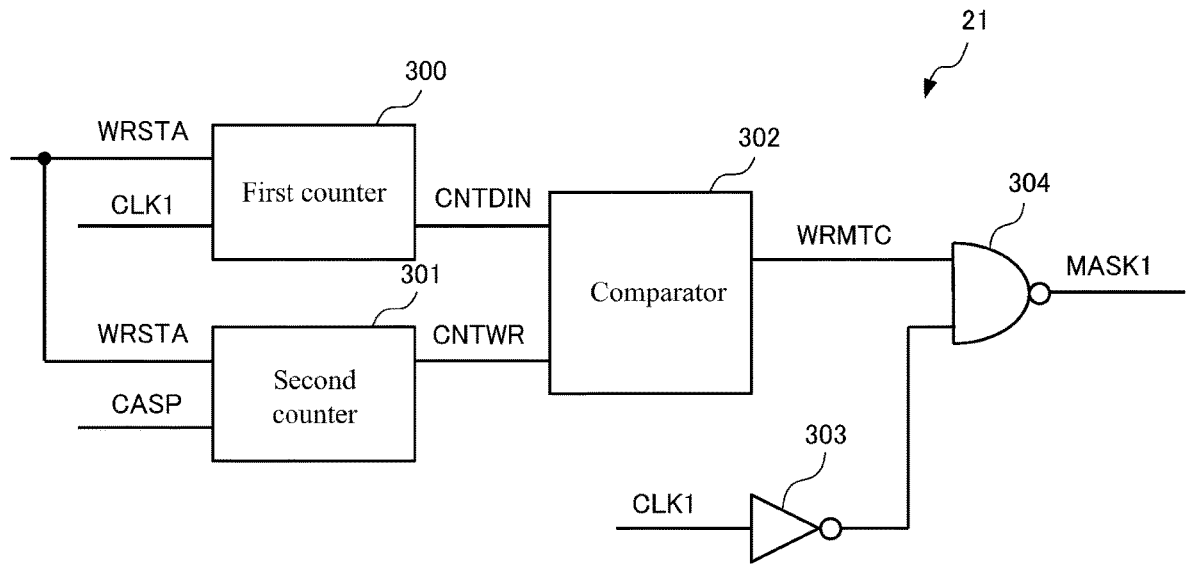
FIG. 9 (*a*) shows a configuration schematic diagram of part of a command decoder, and FIG. 9 (*b*) shows a configuration schematic diagram of part of a CK buffer.
Figure 9:
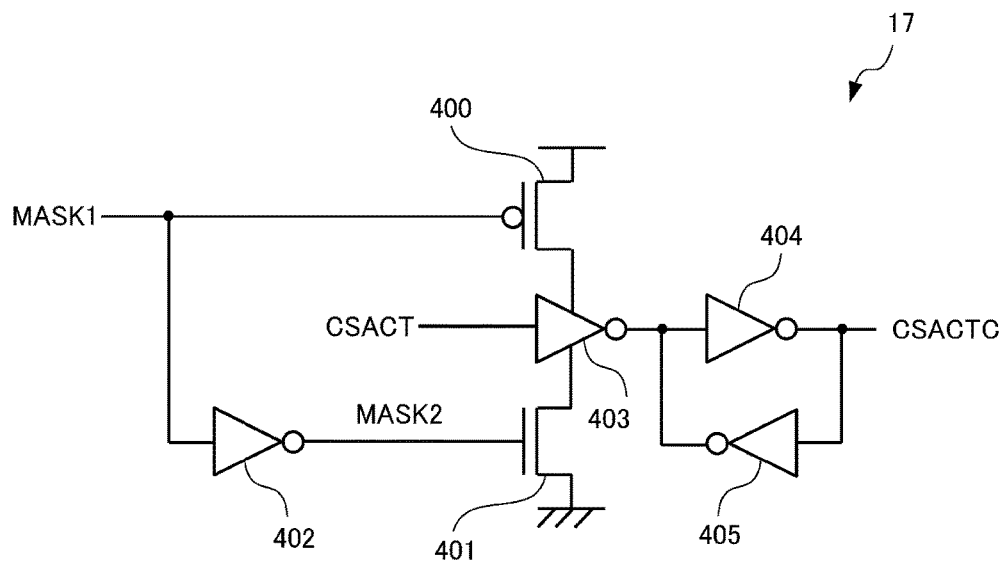

Subsequently, referring to FIG. 9, the configuration of the command decoder 21 and the CK buffer 17 in the present alternative embodiment is described. Referring to FIG. 9 (a), the command decoder 21 includes a first counter 300, a second counter 301, a comparator 30, an inverter 303 and a NAND circuit 304.

While an asserted (high level) signal WRSTA indicating a write operation state is being input, in the data-to-be-written for the clocks of the internal clock signal CLK1 input from the CK buffer 17, at each falling edge of the clocks corresponding to the data-to-be-written, the first counter 300 counts the number of data-to-be-written input in the data-to-be-written. Then, the first counter 300 outputs a signal CNTDIN indicating the count value to the comparator 302.

Here, the signal WRSTA may be generated by the command decoder 21. According to the external clock signal CK, when the input command (CMD) is indicated as a write command, the command decoder 21 may generate the asserted (high level) signal WRSTA.

While the asserted (high level) signal WRSTA is being input, at each falling edge of the clocks of the column control signal CASP input from the command decoder 21, the second counter 301 counts the number of data-to-be-written written into any memory cell in the write command. Then, the second counter 301 outputs a signal CNTWR indicating the count value to the comparator 302.

The comparator 302 compares the signal CNTDIN input from the first counter 300 with the signal CNTWR input from the second counter 301. Then, when the indication values of the respective signals CNTDIN and CNTWR are consistent, the comparator 302 outputs a high level signal WRMTC to the NAND circuit 304. On the other hand, when the indication values of the respective signals CNTDIN and CNTWR are inconsistent, the comparator 302 outputs a low level signal WRMTC to the NAND circuit 304.

The inverter 303 logically inverts the internal clock signal CLK1 input from the CK buffer 17, and outputs the logically inverted signal to the NAND circuit 304.

The signal WRMTC output from the comparator 302 is input to an input terminal of the NAND circuit 304. Also, the signal output from the inverter 303 is input to the other input terminal of the NAND circuit 304. Furthermore, the NAND circuit 304 performs NAND operation based on the input signals, and outputs the operation result MASK1 to the CK buffer 17.

Subsequently, referring FIG. 9 (b), the configuration of part of the CK buffer 17 is described. The CK buffer 17 includes a P-channel MOSFET 400, an N-channel MOSFET 401 and four inverters 402, 403, 404 and 405.

Furthermore, the configuration of the MOSFETs 400, 401 and the four inverters 402, 403, 404 and 405 is identical to the configuration of the MOSFETs 100, 101 and the four inverters 102, 103, 104 and 105 shown in FIG. 3 (a), except that the signal MASK1 is input to the gate of the MOSFET 400, the signal MASK2 is input to the gate of the MOSFET 401, and the control signal CSACTC is output from the inverter 404.

Figure 10:
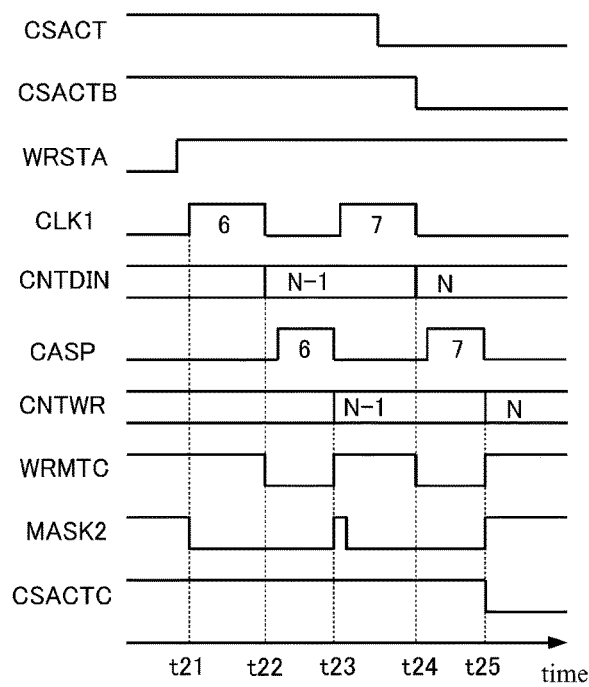
FIG. 10 (*a*) and FIG. 10 (*b*) show timing diagrams of the variation with time of signals in part of a command decoder and part of a CK buffer.
Figure 10:
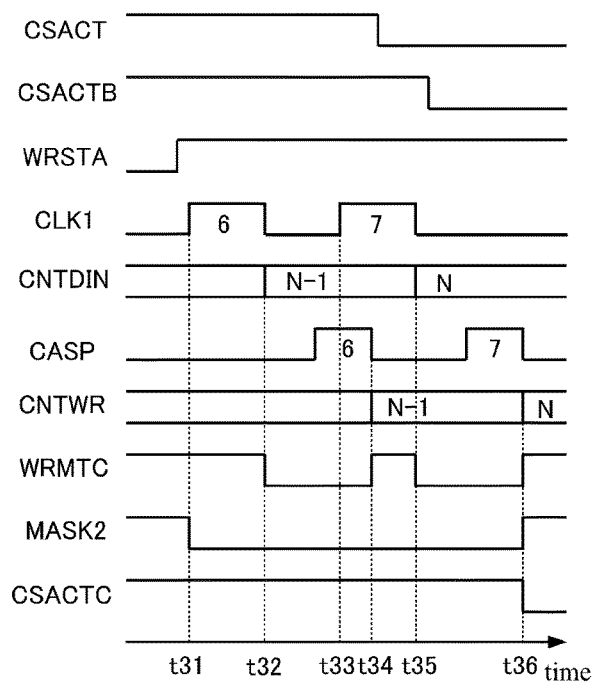

Referring to FIG. 10, the operation of the part of the command decoder 21 shown in FIG. 9 (a) and the operation of the part of the CK buffer 17 shown in FIG. 9 (b) are described. Here, FIG. 10 (a) shows the case that the clock (e.g. the sixth clock) of the column control signal CASP generated based on the clock (e.g. the sixth clock) of the internal clock signal CLK1 is negated (low level) before the next clock (e.g. the seventh clock) of the internal clock signal CLK1 is asserted (high level). On the other hand, FIG. 10 (b) shows the case that the clock (e.g. the sixth clock) of the column control signal CASP generated based on the clock (e.g. the sixth clock) of the internal clock signal CLK1 is not negated (low level) before the next clock (e.g. the seventh clock) of the internal clock signal CLK1 is asserted (high level).

First, referring to FIG. 10 (a), when the inverted chip select signal CSACT is asserted (high level), the internal clock signal CLK1 is negated (low level), and the count values of the first counter 300 and the second counter 301 are consistent (i.e. the signal WRMTC is at a high level), the signal MASK1 is at a low level, and the signal MASK2 is at a high level. As such, the inverter 403 logically inverts the input inverted chip select signal CSACT and outputs the logically inverted signal to the inverter 404. Also, the inverter 404 logically inverts the input signal and outputs the logically inverted signal as the asserted (high level) second control signal CSACTC.

Subsequently, when the sixth clock of the external clock signal CK is asserted (high level), at time t21, the sixth clock of the internal clock signal CLK1 is asserted (high level). Here, the signal MASK1 changes to high level and the signal MASK2 changes to low level. In such case, due to the respective MOSFET 400 and MOSFET 403 changes to the cut-off state, the operation of the inverter 403 is stopped, and the voltage level at the output terminal of the inverter 403 remains low. As such, the second control signal CSACTC remains asserted (high level).

Subsequently, at time t22, the sixth clock of the internal clock signal CLK1 is negated (low level). Here, by the increase of the count value of the first counter 300, due to the value of the respective signals CNTDIN and CNTWR being different, the signal WRMTC changes to low level. In such case, due to the signal MASK2 being at a low level, the second control signal CSACTC remains asserted (high level).

Then, after particular time duration of the falling edge of the sixth clock of the internal clock signal CLK1, the clock (the sixth clock) of the column control signal CASP is asserted (high level). As such, the data-to-be-written (DE6, DO6) input by the sixth clock of the external clock signal CK is written into the memory cells. Then, at time t23, when the clock (the sixth clock) of the column control signal CASP is negated (low level), the count value of the second counter 301 increases. As such, due to the values of the respective signals CNTDIN and CNTWR being equal, the signal WRMTC changes to high level. Moreover, when the signal MASK1 changes to low level and the signal MASK2 changes to high level, the inverter 403 starts operation. Here, the second control signal CSACTC remains asserted (high level).

Additionally, while the seventh clock of the internal clock signal CLK1 is asserted (high level), when the chip select signal CS #changes from asserted (low level) to negated (high level), the inverted chip select signal CSACTC changes from asserted (high level) to negated (low level).

Subsequently, at time t24, the seventh clock of the internal clock signal CLK1 is negated (low level). Here, by the increase of the count value of the first counter 300, due to the values of the respective signals CNTDIN and CNTWR being different, the signal WRMTC changes to low level. Here, due to the signal MASK2 being at a low level, the second control signal CSACTC remains asserted (high level).

Then, after particular time duration of the falling edge of the seventh clock of the internal clock signal CLK1, the clock (the seventh clock) of the column control signal CASP is asserted (high level). As such, the data-to-be-written (DE7, DO7) input by the seventh clock of the external clock signal CK is written into the memory cells. Then, at time t25, when the clock (the seventh clock) of the column control signal CASP is negated (low level), the count value of the second counter 301 increases. As such, due to the values of the respective signals CNTDIN and CNTWR being equal, the signal WRMTC changes to high level. Also, when the signal MASK1 changes to low level and the signal MASK2 changes to high level, the inverter 403 starts operation. The inverter 403 logically inverts the input inverted chip select signal CSACT and outputs the logically inverted signal to the inverter 404. Here, due to the logic level of the first control signal CSACTB and the logic level of the inverted chip select signal CSACT being the same (which is low level here), the second control signal CSACTC is negated (low level).

Here, due to the respective first control signal CSACTB and second control signal CSACTC being negated (low level), the command decoder 21 outputs the negated (low level) signal ENDQDRV. As such, the operation of the DCK buffer 12 is ended, and the operation of the DFF 13 is subsequently ended.

In this manner, by writing the data-to-be-written (DE7, DO7) into any memory cell, the CK buffer 17 may operate the DFF 13, until the number of data-to-be-written written into any memory cell in the write command reaches the number of data-to-be-written input in the write command.

Subsequently, the case shown in FIG. 10 (b) is described. Here, the states of the respective signals at time t31 and time t32 are identical to the states of the respective signals at time t21 and time t22 shown in FIG. 10 (a).

At time t33, while the clock (the seventh clock) of the column control signal CASP is asserted (high level), and when the seventh clock of the internal clock signal CLK1 is asserted (high level), due to the values of the respective signals CNTDIN and CNTWR still being different, the signal WRMTC changes to low level. Also, due to the signal MASK2 being at a low level, the second control signal CSACTC remains asserted (high level).

Subsequently, at time t34, when the clock (the sixth clock) of the column control signal CASP is negated (low level), the count value of the second counter 301 increases. As such, due to the values of the respective signals CNTDIN and CNTWR being equal, the signal WRMTC changes to high level. Here, due to the seventh clock of the internal clock signal CLK1 being asserted (high level), the signal MASK2 remains at a low level. Thus, the second control signal CSACTC remains asserted (high level).

Then, at time t35, the seventh clock of the internal clock signal CLK1 is negated (low level). Here, by the increase of the count value of the first counter 300, due to the values of the respective signals CNTDIN and CNTWR being different, the signal WRMTC changes to low level. In such case, due to the signal MASK2 being at a low level, the second control signal CSACTC remains asserted (high level).

The states of the respective signals at time t36 are identical to the states of the respective signals at time t25.

As described above, in accordance to the present alternative embodiment, the adjustment of the effective timing between the internal clock signal CLK1 and the column control signal CASP is not needed to obtain the same effect with aforementioned Embodiment 2. Furthermore, when inputting the write command, due to the time variation of the signals in the semiconductor memory device of the present alternative embodiment being identical to the time variation of the signals in aforementioned Embodiment 2, the description thereof is omitted.

As described above, in the semiconductor memory device in accordance with the present alternative embodiment, because the operation of DFF 13 (the transmission circuit) continues until the number of data-to-be-written written into the memory cells in the write command reaches the number of the data-to-be-written input in the write command (i.e. the data-to-be-written (DE7, DO7) (the first data-to-be-written) being written into the memory cells), the data-to-be-written (DE7, DO7) may be further properly sent to the memory cell array.

Furthermore, in the aforementioned various embodiments and the alternative embodiment, although the description is made with an example in which the semiconductor memory device is a pSRAM using HyperBus™ interface, such case may result in further effects described below.

Figure 11:
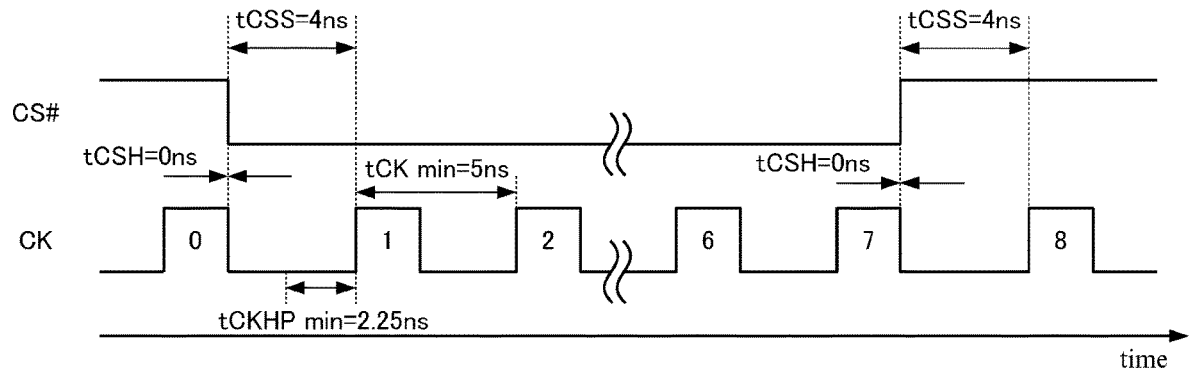
FIG. 11 (*a*) shows an illustrative schematic diagram of the input timing of a chip select signal based on the specification of a current semiconductor memory device, FIG. 11 (*b*) shows an illustrative schematic diagram of a case where the chip select is adjusted to input a clock signal with a fixed frequency based on the specification of a current semiconductor memory device, and FIG. 11 (*c*) shows an illustrative schematic diagram of the input timing of a chip select signal in a semiconductor memory device regarding the embodiments and alternative embodiments of the present invention.
Figure 11:
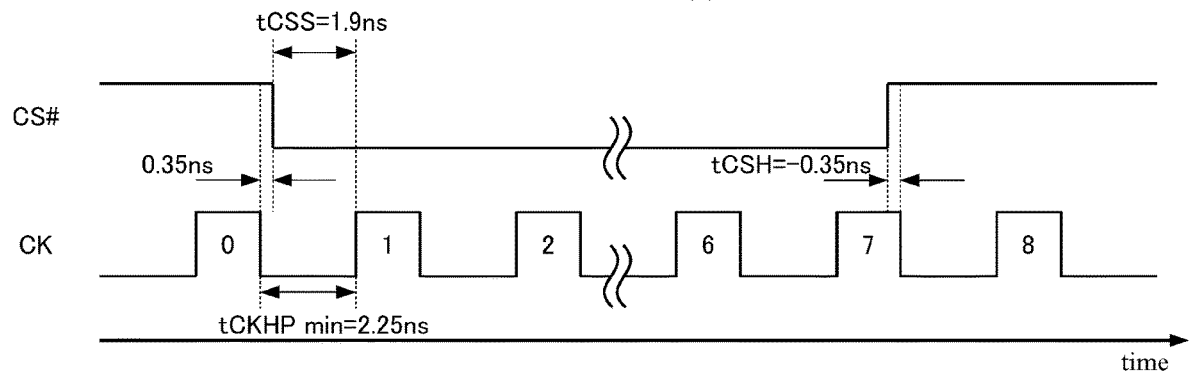
Figure 11:
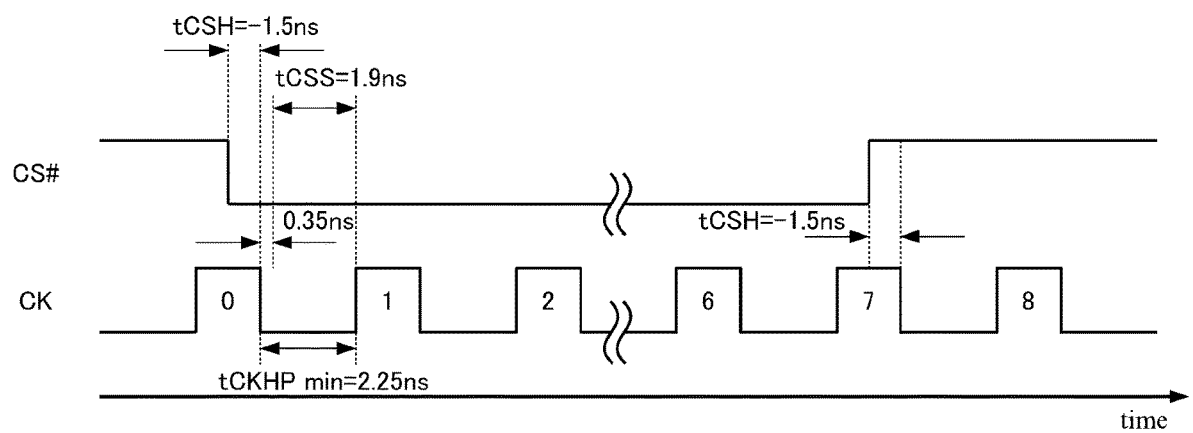

FIG. 11 (a) shows an illustrative schematic diagram of the input timing of the chip select signal CS #based on a current semiconductor memory device specification. In HyperBus™ interface specification, the dynamic property (the AC property) of the chip select signal CS #is defined. FIG. 11 (a) shows an example of the minimum values of the respective parameters when the external clock signal CK is 200 MHz. Here, tCSS is the setup time of the chip select signal CS #until the rising edge of the next external clock signal CK, tCSH is the hold time of the chip select signal CS #after the falling edge of the external clock signal CK. Also, tCK is the clock cycle, and tCKHP is the clock half cycle.

As shown in FIG. 11 (a), based on the respective parameters, when adjusting the input timing of the chip select signal CS #, due to the interval between the zeroth clock and the first clock and the interval between the seventh clock and the eighth clock of the external clock signal CK being different from the intervals between the other clocks, it is difficult to input the external clock signal CK with a fixed frequency.

Thus, as shown in FIG. 11 (b), whether the chip select signal CS #is asserted (low level), when the respective parameters are re-defined to allow the external clock signal CK being input at a fixed frequency, due to the range of the timing margin of tCSH being narrow (approximately 0.7 ns), it is still difficult to input, for example, a high-frequency (e.g. 200 MHz) external clock signal CK with a fixed frequency. Additionally, in current semiconductor memory devices, while the clock (which is the seventh clock here) of the external clock signal CK is asserted (high level), when the chip select signal CS #is negated (high level), the data-to-be-written input at said clock is not sent to the memory cell array, which may cause the data-to-be-written being difficult to be written into the memory cells in the memory cell array.

On the other hand, as shown in FIG. 11 (c), the semiconductor memory device in accordance with the aforementioned various embodiments and the alternative embodiment may transmit the data-to-be-written to the memory cell array even if the chip select signal CS #changes from asserted (low level) to negated (high level). Furthermore, due to the data-to-be-written being able to be written into the memory cells in the memory cell array, the value of tCSH may expand negatively (e.g. −1.5 ns). As such, the range of the timing margin of tCSH may expand to approximately 1.85 (=1.5+1.35) ns. Thus, the semiconductor memory device in accordance with the aforementioned various embodiments and the alternative embodiment may continue inputting the high-frequency (e.g. 200 MHz) external clock signal CK whether the chip select signal CS #is asserted while maintaining compatibility with the HyperBus™ interface specification. Thus, the performance of the system combining the external device (e.g. the memory controller) and the semiconductor memory device may be improved.

The aforementioned various embodiments and the alternative embodiment are described for easily understanding the present invention and are not described to limit the present invention. Thus, the various features shown in the aforementioned various embodiments and the alternative embodiment are intended to include all the design modifications and equivalents that belong to the technical scope of the present invention.

For example, in the aforementioned various embodiments and the alternative embodiment, although the description is made with the case using HyperBus™ interface, the present invention is not limited thereto. For example, even in the case that Xccella™ interface is used, the same effects with the aforementioned various embodiments and the alternative embodiment may be obtained.

Also, in the aforementioned various embodiments and the alternative embodiment, the low-level assert signals may be changed into high-level assert signals. Also, the high-level assert signals may be changed into low-level assert signals.

Additionally, in the aforementioned various embodiments and the alternative embodiment, although the description is made with the example that the CK buffer 17 serves as the control circuit, the present invention is not limited thereto. For example, other circuits with the configuration shown in FIG. 3 (a), FIG. 6 (a) and/or FIG. 9 (b) may be provided as the control circuit.

Moreover, in the aforementioned various embodiments and the alternative embodiment, although the description is made with the example that the command decoder 21 has the configuration shown in FIG. 9 (a), the present invention is not limited thereto. For example, the configuration shown in FIG. 9 (a) may be provided in the CK buffer 17 or be provided in another circuit.

Furthermore, in the aforementioned various embodiments and the alternative embodiment, although toe description is made with the example that the chip select signal CS #changes from asserted to negated while the last data-to-be-written (the data-to-be-written (DE7, DO7)) is being input in the write command, the present invention is not limited thereto. For example, even if the chip select signal CS #changes from asserted to negated while other data-to-be-written (e.g. the data-to-be-written (DE6, DO6)) is being input, the aforementioned various embodiments and the alternative embodiment may have the same functions and effects.

Also, the configurations shown in FIG. 3 (a), FIG. 6 (a), FIG. 9 (a) and FIG. 9 (b) are examples that may be changed as appropriate, and various types of other configurations may be adopted as well.

Additionally, in the aforementioned various embodiments and the alternative embodiment, the configurations of the I/O part 10 and the control logic part 20 are examples that may be changed as appropriate, and various types of other configurations may be adopted as well.

What is claimed is:

1. A semiconductor memory device, performing a write operation in response to a chip select signal in an asserted state, comprising:
    a memory cell array, comprising a plurality of memory cells;
    a transmission circuit, wherein when the chip select signal is in the asserted state, the transmission circuit obtains data-to-be-written according to an external clock signal, and transmits the data-to-be-written to the memory cell array; and
    a control circuit, wherein according to the external clock signal, during the inputting of first data-to-be-written in the data-to-be-written, and after the chip select signal changes from the asserted state to a negated state, the control circuit maintains the operation of the transmission circuit, so as to make the first data-to-be-written be transmitted to the memory cell array.

2. The semiconductor memory device as claimed in claim 1, wherein the first data-to-be-written is the last data-to-be-written in a write command.

3. The semiconductor memory device as claimed in claim 1, wherein the control circuit is configured to generate a first control signal according to the inversion of the chip select signal, and the control circuit is configured to maintain the operation of the transmission circuit by keeping the first control signal for activating the transmission circuit in the asserted state, even if the chip select signal changes to the negated state.

4. The semiconductor memory device as claimed in claim 3, wherein the control circuit is further configured to generate an internal clock signal according to the external clock signal, and while the internal clock signal for generating a data clock signal is in the asserted state, the control circuit maintains the first control signal in the asserted state; and the data clock signal is a signal for transmitting the first data-to-be-written to the memory cell array.

5. The semiconductor memory device as claimed in claim 1, wherein the control circuit operates the transmission circuit until the first data-to-be-written is written into any of the memory cells in the memory cell array.

6. The semiconductor memory device as claimed in claim 5, wherein the control circuit is configured to receive a column control signal, and while the column control signal is in the asserted state, the control circuit operates the transmission circuit;
wherein the column control signal is a signal for selecting a bit line of a memory cell for the first data-to-be-written to be written into.

7. The semiconductor memory device as claimed in claim 5, wherein, by the first data-to-be-written being written into any of the memory cells, the control circuit operates the transmission circuit, until the number of data-to-be-written written into any of the memory cells in the write command reaches the number of data-to-be-written input by the write command.

8. The semiconductor memory device as claimed in claim 1, wherein during a period between the chip select signal changes from the asserted state to the negated state and the chip select signal changes to the next asserted state, the control circuit ends the operation of the transmission circuit.

9. The semiconductor memory device as claimed in claim 1, wherein the external clock signal is input at a fixed frequency.

10. The semiconductor memory device as claimed in claim 4, further comprising:
a command decoder coupled to the control circuit to receive the internal clock signal and the first control signal, configured to generate a data clock buffer control signal; and
a data clock buffer coupled to the transmission circuit, the data clock buffer being configured to be activated according to an asserted state of the data clock buffer control signal, and while the data clock buffer is being activated, to generate a signal for obtaining the data-to-be-written and the data clock signal in response to the internal clock signal.

11. The semiconductor memory device as claimed in claim 10, further comprising:
a chip select signal receiver configured to generate an internal chip select signal according to the chip select signal;
a chip select buffer coupled to the chip select signal receiver, and configured to output a data receiver control signal and an external clock signal receiver control signal;
a data receiver coupled to the transmission circuit and the chip select buffer, wherein the data receiver is configured to be activated according to an asserted state of the data receiver control signal, so as to receive the data-to-be-written from an external device; and
an external clock signal receiver coupled to the control circuit and the chip select buffer, configured to be activated according to the external clock signal receiver control signal, so as to output the external clock signal to the control circuit.

12. The semiconductor memory device as claimed in claim 10, wherein when the data clock buffer control signal is in the asserted state, and when receiving the signal for obtaining the data-to-be-written from the data clock buffer, the transmission circuit obtains the data-to-be-written from the data receiver, and outputs an address signal in the obtained data-to-be-written to the command decoder.

13. The semiconductor memory device as claimed in claim 10, wherein while the transmission circuit is obtaining the data-to-be-written from the data receiver, and while receiving the data clock signal from the data clock buffer, the transmission circuit parallel transforms and stores the data-to-be-written, and transmits the data-to-be-written to the memory cell array according to the data clock signal.

14. The semiconductor memory device as claimed in claim 10, wherein the control circuit generates a second control signal in the asserted state according to the inversion of the chip select signal, and outputs the second control signal to the command decoder; and
when either of the first control signal or the second control signal received by the command decoder is in the asserted state, the command decoder generates the data clock buffer control signal in the asserted state.

15. The semiconductor memory device as claimed in claim 1, wherein the control circuit includes a delay circuit, the chip select signal is provided to the delay circuit according to an internal clock signal, the delay circuit being configured to delay the received chip select signal to generate a first control signal, and starting from the chip select signal changes from the asserted state to the negated state, while the internal clock signal remains in the asserted state, the delay circuit maintains the first control signal in the asserted state, so as to maintain the operation of the transmission circuit.

16. The semiconductor memory device as claimed in claim 15, wherein, after the chip select signal and the internal clock signal change to the negated state, and while the delay circuit performs the delay, the delay circuit keeps the first control signal in the asserted state, so as to maintain the operation of the transmission circuit.

17. The semiconductor memory device as claimed in claim 10, wherein the command decoder is further configured to generate an operation result signal according to the internal clock signal and a column control signal, and the control circuit is configured to generate a second control signal according to the operation result signal, wherein the control circuit configures a period that the second control signal remains in the asserted state as longer than a period that the first control signal remains in the asserted state.

18. The semiconductor memory device as claimed in claim 6, wherein, by the first data-to-be-written being written into any of the memory cells, the control circuit operates the transmission circuit, until the number of data-to-be-written written into any of the memory cells in the write command reaches the number of data-to-be-written input by the write command.

* * * * *